United States Patent
Watanabe et al.

(10) Patent No.: US 7,253,131 B2
(45) Date of Patent: Aug. 7, 2007

(54) CURING RESIN COMPOSITION AND SEALANTS AND END-SEALING MATERIALS FOR DISPLAYS

(75) Inventors: Takashi Watanabe, Mishima-gun (JP); Yuichi Oyama, Mishima-gun (JP); Takuya Yamamoto, Mishima-gun (JP); Nobuo Sasaki, Sakurai (JP); Tazoh Ikeguchi, Tenri (JP); Makoto Nakahara, Nara (JP)

(73) Assignees: Sekisui Chemical Co., Ltd., Osaka (JP); Sharp Kabushiki Kaisha, Osaka (JP)

( * ) Notice: Subject to any disclaimer, the term of this patent is extended or adjusted under 35 U.S.C. 154(b) by 39 days.

(21) Appl. No.: 10/477,838

(22) PCT Filed: May 16, 2002

(86) PCT No.: PCT/JP02/04728

§ 371 (c)(1),
(2), (4) Date: Jun. 14, 2004

(87) PCT Pub. No.: WO02/092718

PCT Pub. Date: Nov. 21, 2002

(65) Prior Publication Data

US 2004/0258921 A1    Dec. 23, 2004

(30) Foreign Application Priority Data

| May 16, 2001 | (JP) | ............................ 2001-146570 |
| Nov. 16, 2001 | (JP) | ............................ 2001-351616 |
| Dec. 5, 2001 | (JP) | ............................ 2001-371712 |
| Dec. 7, 2001 | (JP) | ............................ 2001-374506 |
| Dec. 26, 2001 | (JP) | ............................ 2001-394803 |
| Feb. 28, 2002 | (JP) | ............................ 2002-053807 |

(51) Int. Cl.
*C08F 4/00* (2006.01)
*B01J 31/02* (2006.01)
*B01J 27/00* (2006.01)

(52) U.S. Cl. .......................... 502/5; 502/159; 502/167; 502/172

(58) Field of Classification Search ................... 502/5, 502/159, 167, 172
See application file for complete search history.

(56) References Cited

U.S. PATENT DOCUMENTS 4,922,004 A * 5/1990 Kohler et al. ............... 560/221

(Continued)

FOREIGN PATENT DOCUMENTS

EP    0 798 312 A1    10/1997

(Continued)

*Primary Examiner*—Susan Berman
(74) *Attorney, Agent, or Firm*—Connolly Bove Lodge & Hutz LLP

(57) ABSTRACT

The invention provides a curing resin composition to be used for a sealant or an end-sealing material for a display element, which comprises a curing resin together with a photopolymerization initiator and/or a curing agent and, has a carbonyl group derived from a (meth)acryl group together with an epoxy group and/or a hydroxyl group derived from an epoxy group and, a cured product of which has nitrogen atoms at a ratio of 3 to 10% by atom in the total of carbon atoms, hydrogen atoms and nitrogen atoms in the composition; a volume resistance of $1\times10^{13}$ Ω·cm or higher; a dielectric constant of 3 or higher at 100 kHz; and a glass transition temperature of 80 to 150° C.

5 Claims, 3 Drawing Sheets

U.S. PATENT DOCUMENTS

| | | |
|---|---|---|
| 4,977,293 A | 12/1990 | Hatton et al. |
| 5,100,987 A | 3/1992 | Hatton et al. |
| 5,232,883 A * | 8/1993 | Derleth et al. ............... 502/5 |
| 5,346,958 A * | 9/1994 | Yukawa et al. ............. 525/124 |
| 5,510,307 A * | 4/1996 | Narayanan et al. ......... 502/159 |
| 6,106,914 A * | 8/2000 | Kanbe et al. ............ 428/36.91 |
| 6,110,993 A | 8/2000 | Saito et al. |
| 6,231,751 B1 * | 5/2001 | Canos et al. ........... 208/120.01 |
| 2003/0147034 A1 | 8/2003 | Kojima |
| 2006/0073334 A1* | 4/2006 | Schwantes et al. ...... 428/402.2 |

FOREIGN PATENT DOCUMENTS

| | | |
|---|---|---|
| GB | 2 272 906 A | 6/1994 |
| JP | 58-173118 | 10/1983 |
| JP | S59-59720 | 4/1984 |
| JP | S62-146915 | 6/1987 |
| JP | S63-265221 | 11/1988 |
| JP | 64-070440 | 3/1989 |
| JP | H1-243029 | 9/1989 |
| JP | H2-292325 | 12/1990 |
| JP | 05-214310 | 8/1993 |
| JP | H5-295087 | 11/1993 |
| JP | H6-160872 | 6/1994 |
| JP | H6-227811 | 8/1994 |
| JP | H6-287198 | 10/1994 |
| JP | H7-13173 | 1/1995 |
| JP | H7-13174 | 1/1995 |
| JP | H7-13175 | 1/1995 |
| JP | H7-56178 | 3/1995 |
| JP | 09-005759 | 1/1997 |
| JP | 09-087364 | 3/1997 |
| JP | H11-109384 | 4/1999 |
| JP | 2000-66220 | 3/2000 |
| JP | 2000-219868 | 8/2000 |
| JP | 2000-338505 | 12/2000 |
| JP | 2001-100224 | 4/2001 |
| JP | 2001-133794 | 5/2001 |

* cited by examiner

CURING RESIN COMPOSITION AND SEALANTS AND END-SEALING MATERIALS FOR DISPLAYS

FIELD OF THE INVENTION

The invention relates to a curing resin composition which scarcely causes pollution of a liquid crystal owing to elution of its components to the liquid crystal material and therefore, causes little unevenness of color in liquid crystal display in the case of using it as a sealant for a liquid crystal display element or an end-sealing material for a liquid crystal display element in fabrication of a liquid crystal display element and that is excellent in the storage stability and therefore, optimum for fabrication of a display apparatus especially by one drop fill process and relates to a sealant for a display element and an end-sealing material for a display element using the composition.

BACKGROUND ART

Conventionally, a liquid crystal display element such as a liquid crystal display cell is fabricated by setting two electrode-bearing transparent substrates face to face at a pre-scribed distance, forming a cell by sealing their surrounding with a sealant, injecting a liquid crystal into the cell through a liquid crystal injection inlet formed in a portion of the cell, and sealing the liquid crystal injection inlet by the sealant or an end-sealing material.

In this method, at first, a seal pattern having a liquid crystal injection inlet is formed on one of the two electrode-bearing transparent substrates by screen printing using a thermosetting sealant and then the solvent in the sealant is dried by pre-baking at 60 to 100° C. Next, the two substrates are set face to face while sandwiching a spacer between them, aligned, stuck to each other, and thermally-pressed at 110 to 220° C. for 10 to 90 minutes, and after the gap adjustment in the vicinity of the sealant, the sealant is partly cured by heating at 110 to 220° C. for 10 to 120 minutes in an oven. After that, a liquid crystal is injected through the liquid crystal injection inlet and finally the liquid crystal injection inlet is sealed by an end-sealing material to fabricate a liquid crystal display element.

However, there are the following problems in this fabrication method: displacement due to thermal press, unevenness of gaps, and deterioration of adhesion strength between a sealant and a substrate take place: foaming occurs by the thermal expansion of a remaining solvent to result in unevenness of gaps and sealant pass: it takes a long time for sealant curing: the pre-baking process is complicated: the usable time of the sealant is short owing to solvent evaporation: injection of a liquid crystal takes a long time: and the like. Above all, in the case of a recent liquid crystal display apparatus with a large size, it becomes a serious problem that injection of a liquid crystal takes rather a long time.

For that, a liquid crystal display element fabrication method, so-called one drop fill process, using a photocuring and thermocuring sealant has been investigated. In the one drop fill process, a rectangular seal pattern is formed at first in one of two electrode-bearing transparent substrates by screen printing. Next, fine droplets of a liquid crystal in an uncured state of the sealant are dropwise applied to the entire face of the entire frame of the transparent substrate and immediately the other transparent substrate is layered and UV rays are radiated to the sealed part to carry out temporal curing. After that, at the time of liquid crystal annealing, the curing is actually carried out by heating to fabricate a liquid crystal display element. If the substrates are stuck to each other in reduced pressure, the liquid crystal display element can be fabricated at an extremely high efficiency. In the future, this one drop fill process is expected to be a main stream of methods for fabricating liquid crystal display apparatus.

Sealants employed in conventional processes are, for example, adhesives mainly containing partly (meth)acrylated bisphenol A type epoxy resins disclosed in Japanese Kokai Publication Hei-6-160872, 1-243029, 7-13173, 7-13174, 7-13175, and the like and also liquid crystal sealants mainly containing (meth)acrylates disclosed in Japanese Kokai Publication Hei-7-13174.

However, these sealants tend to exhibit polarity values similar to those of liquid crystal materials and both have affinity to each other. Accordingly, in a liquid crystal display element assembled using such a sealant by the one drop fill process, a component of the sealant may be eluted in the liquid crystal to cause orientation disorder of the liquid crystal in the peripheral part of the sealant and result in defective display such as uneven coloration. Especially, since the one drop fill process involves a step of bringing the uncured sealant into direct contact with the liquid crystal, the liquid crystal pollution with such a component of the sealant has become a serious problem. Further, among the above-mentioned sealants, a sealant comprising a thermosetting component has a problem that it is considerably inferior in storage stability at a room temperature and therefore requires to be stored in a frozen state and being contaminated with water at the time of thawing or once being thawed, it becomes thickened at a room temperature and therefore has to be used in a short time. Moreover, in the case of a sealant to be cured only by light radiation, it is poor in humidity resistance and a part shielded from light is inferior in the curing ratio.

Further, there are other problems relevant to residues such as an un-reacted polymerization initiator and a curing agent contained in a sealant after curing; an ionic impurity such as chlorine or the like; and a silane coupling agent. Owing to applications of liquid crystal panels to mobile appliances with saved power consumption, a liquid crystal with low driving voltage (a low voltage type liquid crystal) tends to be used in these years. The low voltage type liquid crystal is easy to take in impurities attributed to a particularly high dielectric anisotropy and easy to cause orientation disorder and decrease of voltage holding ratio with time. That is, owing to intake of the residues such as an unreacted polymerization initiator and an initiator after curing contained in a sealant; an ionic impurity such as chlorine; and a silane coupling agent, problems such as orientation disorder and decrease of voltage holding ratio with time are caused.

For that, countermeasures such as decreasing the amount of a polymerization initiator contained in the sealant or making a polymerization initiator into a high molecular weight has been investigated. However, such a method is not only incapable of sufficiently suppressing the elution to the liquid crystal but also decreases the reactivity, resulting in requirement of a large quantity of light rays for curing the sealant or the like and adverse effects on the liquid crystal.

Further, with respect to ionic impurities, Japanese Patent Kokai Publication Hei-5-295087 discloses a method for removing ionic impurities by washing a sealant, an end-sealing material, and their raw materials with water or an organic solvent and carrying out reduced-pressure drying. However, such a method requires extremely complicated process and in addition, the method sometimes causes such problems that if the drying of the washed sealant or end-sealing material is insufficient, the solvent remains or that gelling occurs at the time of reducing the pressure in the drying step.

Curing resin compositions to be used for a sealant or an end-sealing material can be broadly classified into two-liquid type that is used by mixing a main agent and a curing agent and one-liquid type that contains a curing agent previously. Although the two-liquid type one can be cured at a room temperature, a curing resin (a main agent) and a curing agent should be separately stored and in the use, it is required to measure and mix the respective components and thus its storage and handling is complicated. Further, since the pot life is limited, a large quantity of the respective components cannot be mixed previously and frequent mixing is required to result in a low efficiency. On the other hand, with respect to the one-liquid type one, reaction occurs during the storage in some cases and it is desired to improve the storage stability. For that, in the case where an epoxy resin is used for the curing resin, an one-liquid type curing resin composition using a dicyandiamide as a curing agent has been known well. However, the resin composition requires a high temperature of not less than 160° C., for curing and cannot meet the requirement, "low temperature and short time curing", which has been required in recent years. As systems capable of satisfying "low temperature and short time curing", there are methods proposed as follows: Japanese Kokai Publication Sho-62-146915 proposes a method using an adduct of an amine and an epoxy compound as a curing agent: Japanese Kokai Publication Hei-2-292325 proposes a method using an imidazole encapsulated by poly(methyl methacrylate) as a curing agent: and Japanese Kokai Publication Sho-59-59720 proposes a method for making the surface of a powder amine compound inert by an isocyanate. However, these methods are very complicated and have a problem of considerable elution of un-reacted amines or the like to liquid crystals.

SUMMARY OF THE INVENTION

It is an object of the invention to provide a curing resin composition that scarcely causes pollution of a liquid crystal owing to elution of its components to the liquid crystal material and therefore, causes little unevenness of color in liquid crystal display in the case of using it as a sealant for a liquid crystal display element or an end-sealing material for a liquid crystal display element in fabrication of a liquid crystal display element and that is excellent in the storage stability and therefore, optimum for fabrication of a display apparatus especially by one drop fill process and to provide a sealant for a display element and an end-sealing material for a display element using the composition.

The first invention is a curing resin composition to be used for a sealant or an end-sealing material for a display element, which comprises a curing resin together with a photopolymerization initiator and/or a curing agent and, has a carbonyl group derived from a (meth)acryl group together with an epoxy group and/or a hydroxyl group derived from an epoxy group and, a cured product of which has nitrogen atoms at a ratio of 3 to 10% by atom in the total of carbon atoms, hydrogen atoms and nitrogen atoms in the composition; a volume resistance of $1 \times 10^{13}$ Ω·cm or higher; a dielectric constant of 3 or higher at 100 kHz; and a glass transition temperature of 80 to 150° C.

The second invention is a curing resin composition to be used for a sealant or an end-sealing material for a display element, which comprises a curing resin together with a photopolymerization initiator and/or a curing agent, has a carbonyl group derived from a (meth)acryl group together with an epoxy group and/or a hydroxyl group derived from an epoxy group and an alkylene oxide skeleton and, has a volume resistance of $10^{13}$ Ω·cm or higher; a dielectric constant of 3 or higher at 100 kHz; and a glass transition temperature of 80 to 150° C.

A cured product of the curing resin compositions of the first and the second inventions preferably has a contact angle with water of 20 to 80 degrees. An uncured form of them also preferably has ion conductivity of an extracted water of 50 µS/cm or lower, a specific resistance of $1.0 \times 10^{6}$ to $1.0 \times 10^{10}$ Ω·cm. Further, in the case of using a sealant or a an end-sealing material for a display element having a light-shielded part, a gelling ratio of the light-shielded part after curing reaction is preferably 70% or higher and the glass transition temperature is preferably 50° C. or higher.

In the curing resin compositions of the first and the second inventions, the curing resin preferably comprises a compound having one or more (meth)acryl groups and epoxy groups each in one molecule. The compound having one or more (meth)acryl groups and epoxy groups each in one molecule preferably comprises a hydroxyl group and/or an urethane bond and have at least one molecular skeleton structure selected from a group consisting of biphenyl skeleton, naphthalene skeleton, bisphenol skeleton, and novolak skeleton and a number average molecular weight of 300 or higher. Further, in the curing resin composition, the equivalent ratio between the (meth)acryl group and the epoxy group is preferably 4:6 to 9:1.

In the curing resin compositions of the first and the second inventions, the curing agent is preferable to have the melting point of 100° C. or higher.

The third invention is a photopolymerization initiator which has a reactive double bond and a photoreaction initiating part. The photopolymerization initiator of the third invention is preferably a benzoin (ether) compound having a reactive double bond together with a hydroxyl group and/or an urethane bond. The reactive double bond is preferably a (meth)acrylic acid residue. The benzoin (ether) compound preferably has the molecular skeleton defined by the following general formula (4).

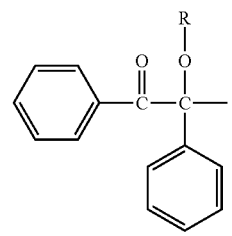

(4)

The fourth invention is a coated curing agent wherein surface of a solid curing agent particle is coated with microparticles. With respect to the coated curing agent of the fourth invention it is preferable to have a weight ratio between the solid curing agent particles and the microparticles in a range of 3:1 to 50:1 and the particle diameter of the microparticles is preferably not larger than 10% of the particle diameter of the solid curing agent particle and the solid curing agent particle is preferably made of an amine compound.

The fifth invention is a curing resin composition obtainable by heating a silane compound having one or more functional groups selected from those shown in the group A represented below and one or more functional groups selected from those shown in the group B represented below and the curing resin composition of the first or the second invention and characterized in that the remaining ratio of one or more functional groups selected from the following B group after heating is 10% or less. The above-mentioned silane compound is preferable to have an $NH_2$ group and/or an NH group.

Group A:

—$OCH_3$, —$OC_2H_5$

Group B:

—$NH_2$, —NH, —SH, —NCO, —CH—$CH_2$
                                        \ /
                                         O

The sixth invention is a silane coupling agent which comprises an imidazole silane compound having a bound structure between imidazole skeleton and alkoxysilyl group via a spacer group.

The curing resin compositions of the first and the second inventions preferably comprise the photopolymerization initiator of the third invention, the coated curing agent of the fourth invention, or the silane coupling agent of the sixth invention.

A curing resin composition of the invention preferably contains also a filler surface treated with at least one compound selected from a group consisting of an imidazole silane compound having a bound structure between an imidazole skeleton and an alkoxysilyl group via a spacer group, an epoxysilane compound, and an aminosilane compound.

The seventh invention is a method for producing a curing resin composition which comprises at least: a step 1 of contacting an ion absorptive solid with a curing resin composition and, a step 2 of separating the ion absorptive solid from the curing resin composition. In the above-mentioned step 1, it is preferable that the ion absorptive solid is contacting the curing resin composition while heating at 40 to 100° C. It is preferable that the above-mentioned ion absorptive solid contains aluminum and that it is a laminar inorganic compound and the laminar inorganic compound is preferably a hydrotalcite group compounds.

The curing resin composition of the first invention is included in compositions obtainable by the method for producing a curing resin composition of the seventh invention.

The eighth invention is a sealant for a display element which is obtainable by using the curing resin composition of the invention.

The ninth invention is an end-sealing material for a display element is obtainable by using the curing resin composition of the invention.

A display apparatus using the sealant for a display element of the eighth invention and/or an end-sealing material for a display element of the ninth invention is also included in the invention.

DISCLOSURE OF THE INVENTION

Figure 1:
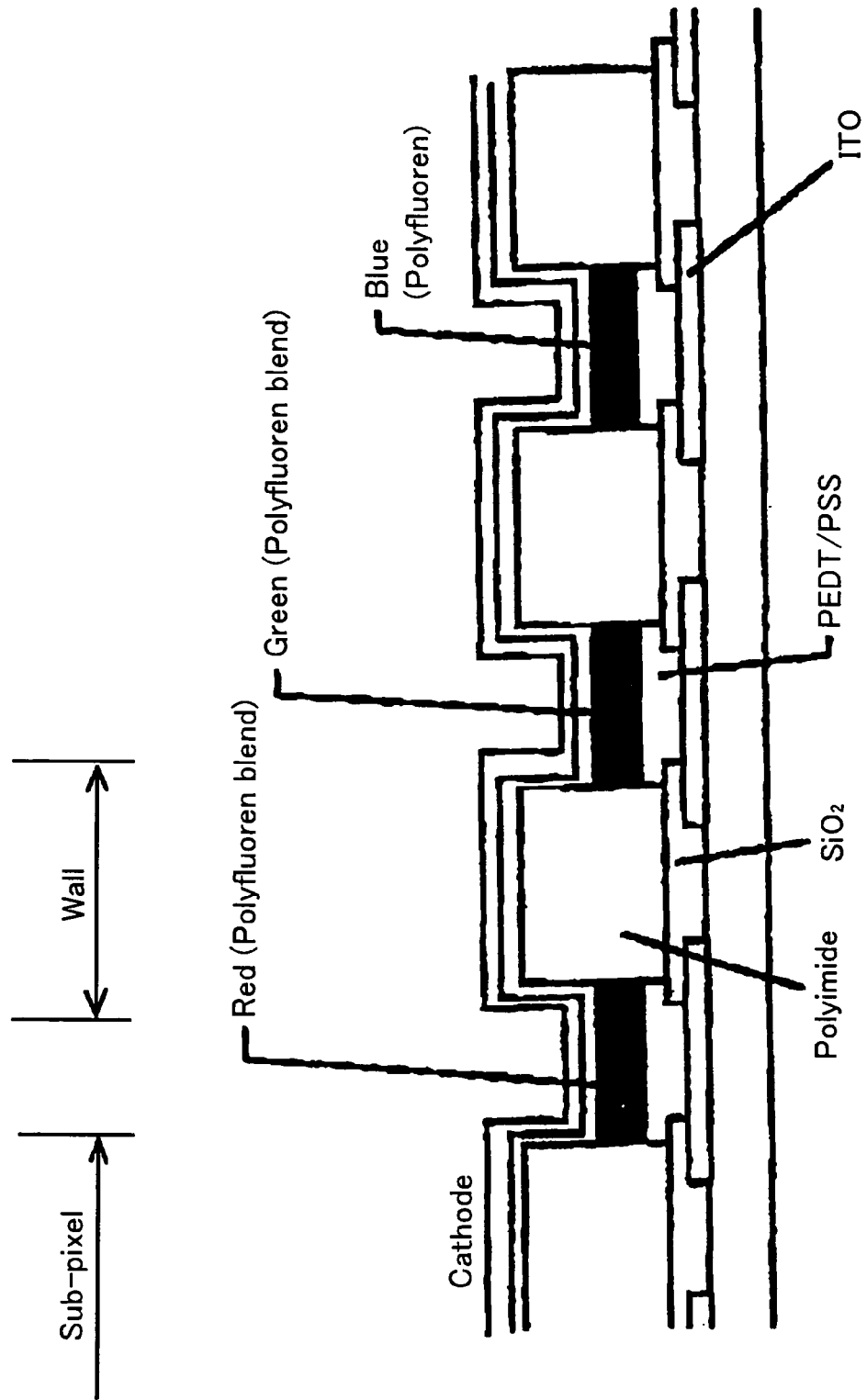
FIG. 1 is a schematic figure illustrating the formation of a light emitting display layer in an organic EL display fabrication.

Hereinafter, the invention will be described in details.

A curing resin composition of the first invention is to be used for a sealant or an end-sealing material for a display element and contains a curing resin together with a photopolymerization initiator and/or a curing agent and has the following characteristics after curing. Owing to such characteristics, the curing resin composition of the invention used as a sealant or an end-sealing material for a liquid crystal display element exhibits excellent adhesion property to a substrate and neither pollutes a liquid crystal owing to elution of its components in the liquid crystal nor causes orientation disorder of the liquid crystal and decrease of the voltage holding ratio with the lapse of time.

That is, the curing resin composition of the first invention has 3 to 10% by atom as a ratio of nitrogen atoms in the total of the carbon atoms, hydrogen atoms, and nitrogen atoms in the case where element analysis is carried out after curing. When the ratio is less than 3% by atom, the adhesion property to a substrate is inferior in the case of using the composition as a sealant or an end-sealing material and when it is more than 10% by atom, humidity resistance is inferior.

The above-mentioned ratio of nitrogen atoms can be calculated from the following equation (1):

nitrogen atom ratio(%)={(total nitrogen atoms)/(total carbon atoms+total hydrogen atoms+total nitrogen atoms)}×100    (1)

The curing resin composition of the first invention has a volume resistance value of $1\times10^{13}$ Ω·cm or higher after curing. When it is less than $1\times10^{13}$ Ω·cm, it means that the curing resin composition of the invention contains an ionic impurity and in the case of using it as a sealant or an end-sealing material, the ionic impurity is eluted in a liquid crystal when electric power is applied and affects the liquid crystal operation voltage and causes defective display.

The curing resin composition of the first invention has a dielectric constant (a specific dielectric constant) of 3 or higher at 100 kHz after curing. With respect to the dielectric constant of a liquid crystal, in general, $\epsilon//$ (parallel) is about 10 and $\epsilon_\perp$ (perpendicular) is about 3.5 and when the dielectric constant is less than 3, the curing resin composition is eluted to a liquid crystal and affects the liquid crystal operation voltage and causes defective display.

The curing resin composition of the first invention has a glass transition temperature of 80 to 150° C. after curing. When the temperature is lower than 80° C., in the case where the composition is used as the sealant or an end-sealing material, the composition is inferior in humidity resistance (high temperature- and high humidity-resistant properties) and when it is more than 150° C., the composition is too rigid and is inferior in the adhesion property to a substrate.

Incidentally, the above-mentioned glass transition temperature is a value measured by a DMA method under conditions of a temperature raising ratio of 5° C./minute and 10 Hz frequency. However, since a large quantity of a sample is required for the measurement of the glass transition temperature by the DMA method, it is preferable to carry out the measurement by a DSC method under a condition of a temperature raising ratio of 10° C./minute in the case where only a slight amount of a sample is obtained. Generally, the glass transition temperature measured by the DSC method is lower by about 30° C. than that measured by the DMA method. Accordingly, in the case where the glass transition temperature is measured by the DSC method, a cured product of the curing resin composition of the first invention has the glass transition temperature of 50 to 120° C.

The curing resin composition of the first invention has a carbonyl group derived from a (meth)acryl group together with an epoxy group and/or a hydroxyl group derived from an epoxy group.

The second invention is a curing resin composition to be used for a sealant or an end-sealing material for a display element, characterized in that the composition contains a curing resin together with a photopolymerization initiator and/or a curing agent and has a carbonyl group derived from a (meth)acryl group together with an epoxy group and/or an hydroxyl group derived from an epoxy group; an alkylene oxide skeleton; a volume resistance of $10^{13}$ Ω·cm or higher; a dielectric constant of 3 or higher at 100 kHz; and a glass transition temperature of 80 to 150° C.

With respect to a cured product of the curing resin composition of the second invention, the volume resistance value, the dielectric constant at 100 kHz, and the glass transition temperature have same as those of the first invention.

The curing resin composition of the second invention has an alkylene oxide skeleton, preferably propylene oxide skeleton. Accordingly, the shrinkage by curing can be suppressed and the adhesion property to a substrate is excellent.

The cured product of the curing resin composition of the first and the second inventions preferably has a contact angle of 20 to 80 degree with water. When it is less than 20 degree, the humidity resistance sometimes becomes inferior and when it is more than 80 degree, the compositions may be eluted to a liquid crystal before curing.

The foregoing contact angle with water can be measured by applying a curing resin composition of the invention thinly and evenly to a glass plate, curing the composition, then forming a water droplet on it, and measuring the contact angle using a contact angle measurement apparatus (for example manufactured by Kyowa Interface Science Co., Ltd.)

The uncured form of the curing resin compositions of the first and the second inventions are preferable to have the following characteristics. In the method for fabricating a liquid crystal element by one drop fill process, since the sealant or the end-sealing material before curing is contacting the liquid crystal, it is important to suppress contamination of the liquid crystal with components of the curing resin compositions of the first and the second inventions before curing.

The uncured form of the curing resin composition of the first and the second inventions preferably has an ion conductivity of extracted water of 50 μS/cm or lower. When it is more than 50 μS/cm, it means the curing resin compositions of the inventions contain ionic impurities and the ionic impurities are eluted to the liquid crystal in the case of using the compositions as a sealant or an end-sealing material and adversely affect the liquid crystal operation voltage and cause defective display. It is more preferably 30 μS/cm or lower.

The above-mentioned ion conductivity of extracted water can be measured by dissolving a curing resin composition of the invention in a solvent, extracting the obtained solution with pure water, and measuring the conductivity of the resulting pure water by a conductivity meter (for example, ES-12 manufactured by Horiba, Ltd.)

The uncured form of the curing resin composition of the first and the second inventions preferably has a specific resistance value of $1.0 \times 10^6$ to $1.0 \times 10^{10}$ Ω·cm. When it is less than $1.0 \times 10^6$ Ω·cm, in the case where they are used as sealants or end-sealing materials and eluted in the liquid crystal, they adversely affect the liquid crystal operation voltage and cause defective display. When it is more than $1.0 \times 10^{10}$ Ω·cm, the elution to the liquid crystal becomes significant and the adhesion strength to a substrate may be deteriorated in some cases.

In the case where a liquid crystal display element is fabricated by one drop fill process using a curing resin composition as a sealant or an end-sealing material, the component elution of a curing resin composition to a relatively low crosslinking degree to the liquid crystal in a light shielded part has sometimes become a problem. That is, a group of wiring terminals made of metal thin layers are formed in the peripheral parts of a liquid crystal display part for supplying voltage to operate liquid crystal molecules, and these parts are shielded from light radiated from the outside of a substrate are called as light shielded parts. In the one drop fill process, in general, after uncured seal parts are formed in two substrates and a liquid crystal is inserted between the substrates, UV rays or the like are radiated to the seal parts to temporarily cure the seal parts and then the seal parts are actually cured by heating. However, in the light shielding parts, UV rays are radiated insufficiently to the seal parts and therefore, a curing resin composition with a relatively low crosslinking degree sometimes remains.

The curing resin compositions of the first and the second inventions preferably have a gelling ratio of 70% or higher and a glass transition temperature of 50° C. or higher after curing reaction in the case where they are used as sealants or end-sealing materials of a liquid crystal display element having the light shielding parts. When the gelling ratio is less than 70%, the curing resin compositions are sometimes easily eluted to the liquid crystal. Also, when the glass transition temperature is less than 50° C., the humidity resistance (resistance to high temperature and high humidity) is deteriorated in some cases. In this case, the glass transition temperature is measured by a DMA method and because of the same reason as described above, in the case where the glass transition temperature is measured by the DSC method, it is preferable to be 20° C. or higher.

The above-mentioned gelling ratio can be calculated by immersing the curing resin composition of the first or the second invention in acetone for 24 hours and carrying out calculation from the dried weights before and after the immersion.

Such characteristics of the curing resin composition of the first and the second inventions can be provided by using a curing resin described hereinafter and selecting a photopolymerization initiator of the third invention, a curing agent of the fourth invention, a curing resin composition of the fifth invention, and a silane coupling agent of the sixth invention based on the necessity and further such curing resin compositions can be produced by the method for producing the curing resin composition of the seventh invention based on the necessity.

The curing resin compositions of the first and the second invention preferably have a hydrogen-bonding functional group value of $3 \times 10^{-3}$ to $5 \times 10^{-3}$ mol/g. Such curing resin compositions are capable of forming hydrogen bonds between molecules, so that in the case of using them as sealants or end-sealing materials, they are hardly eluted to a liquid crystal and scarcely contaminate the liquid crystal both before and after curing.

The above-mentioned hydrogen bonds can be formed by adding compounds, for example, having functional groups such as —OH group, —NH$_2$ group, —NHR group (R represents an aromatic or aliphatic hydrocarbon or a derivative from these), —COOH group, —CONH$_2$ group, and —NHOH group or containing residues such as —NHCO— bond, —NH— bond, —CONHCO— bond, and —NH—NH— bond in a molecular, which have hydrogen bond property. The above-mentioned hydrogen-bonding functional group value is a value calculated according to the following equation (2) in the case where the compound having the above-mentioned hydrogen-bonding functional groups is solely a single compound.

Hydrogen-bonding functional group value $(H_x)$(mol/g)=(the number of hydrogen-bonding functional groups in one molecule of a compound$X$)/(molecular weight of the compound X)      (2)

Further, in the case where the compound having the hydrogen-bonding functional groups is a resin mixture containing a plurality of compounds having the above-mentioned hydrogen-bonding functional groups, the above-mentioned hydrogen-bonding functional group value is a value calculated by multiplying the contents (the weight ratio) of the respective compounds having the hydrogen-bonding functional groups per unit weight. For example, when the compounds having the hydrogen-bonding functional groups are composed of a compound A, a compound B, and a compound C, the hydrogen-bonding functional group value can be defined as the following equation (3).

Hydrogen-bonding functional group value$(H_{ABC})$= $H_A P_A + H_B P_B + H_C P_C$      (3)

($P_\alpha$ represents a weight ratio of the compound $\alpha$)

When the hydrogen-bonding functional group value is less than $3 \times 10^{-3}$ mole/g, the components of a curing resin composition are eluted and easily cause orientation disorder of a liquid crystal and when it is more than $5 \times 10^{-3}$ mole/g, the humidity permeability in the cured substance becomes high and thus water easily penetrates the inside of a liquid crystal display element.

The compound having the above-mentioned hydrogen-bonding functional groups may be those having a hydrogen-is bonding functional group value in the above-mentioned range by themselves or mixtures of two or more compounds having a hydrogen-bonding functional group value adjusted to be in the above-mentioned range as a whole. That is, compounds comprising the hydrogen-bonding functional groups and having the average value of the hydrogen-bonding functional group values in the above-mentioned range may be used.

The above-mentioned curing resin is preferable to contain a compound having at least one (meth)acryl group and epoxy group each in one molecule as a main component. It may contain a compound having only a (meth)acryl group or an epoxy group in one molecule. A sealant or an end-sealing material to be obtained can be both photocuring and thermosetting type by using such a compound for a curing resin and a liquid crystal display element with an excellent gap precision as compared with a display element using a conventional thermosetting sealant or an end-sealing material can be produced by temporarily bonding by previous photocuring and then completely curing by thermosetting.

In this description, (meth)acrylic acid means acrylic acid or methacrylic acid.

The compound having at least one (meth)acryl group and epoxy group each in one molecule is not particularly limited and may include, for example, (meth)acrylic acid-modified epoxy resin and urethane-modified (meth)acryl-epoxy resin and the like.

Preferable examples of the above-mentioned (meth)acrylic acid-modified epoxy resin are partly (meth)acrylated novolak type epoxy resins and bisphenol type epoxy resins; biphenyl type epoxy resins, naphthalene type epoxy resins, tris(hydroxyphenyl)alkyl type epoxy resins, tetrakis(hydroxyphenyl)alkyl type epoxy resins and the like.

The epoxy resin to be a raw material for the above-mentioned (meth)acrylic acid-modified epoxy resin may include, as novolak type ones, phenol novolak type, cresol novolak type, biphenyl novolak type, trisphenol novolak type, dicyclopentadiene novolak type, and the like and as bisphenol type ones, bisphenol A type, bisphenol F type, 2,2'-diallylbisphenl A type, bisphenol S type, hydrogenated bisphenol type, polyoxypropylene bisphenol A type and the like.

Those commercialized among the above-mentioned (meth)acrylic acid-modified epoxy resins are, for example, as phenol novolak type ones, Epiclon N-740, Epiclon N-770, and Epiclon N-775 (all produced by Dainippon Ink and Chemicals, Inc.), Epikote 152 and Epikote 154 (both produced by Japan Epoxy Resin Co.); and as cresol novolak type ones, Epiclon N-660, Epiclon N-665, Epiclon N-670, Epiclon N-673, Epiclon N-680, Epiclon N-695, Epiclon N-665-EXP, Epiclon N-672-EXP (all produced by Dainippon Ink and Chemicals, Inc.).

The above-mentioned partly (meth)acrylated epoxy resin can be obtained by, for example, reacting an epoxy resin and (meth)acrylic acid in the presence of a basic catalyst according to a conventional method. Epoxy resins with a desired acrylated ratio can be obtained by properly changing the mixing ratios of epoxy resins and (meth)acrylic acid.

The above-mentioned urethane-modified (meth)acryl-epoxy resin can be obtained by, for example, the following method. That is, the resin can be produced by a method of causing reaction of a polyol and a bi- or higher-functional isocyanate and further causing reaction of the reaction product with a hydroxyl group-containing a (meth)acrylic monomer and glycidol; a method of causing reaction of a bi- or higher-functional isocyanate with a (meth)acrylic monomer or glycidol without using a polyol; a method of causing reaction of an isocyanate group-containing (meth)acrylate with glycidol; and the like. Partly, for example, at first, reaction of trimethylolpropane 1 mole and isophorone diisocyanate 3 mole is caused in the presence of a tin-based catalyst and successively reaction of the isocyanate groups remaining in the obtained compound with hydroxyethyl acrylate, which is a hydroxyl group-containing acrylic monomer, and glycidol, which is a hydroxyl group-containing epoxy, is caused to produce the resin.

The above-mentioned polyol is not particularly limited and may include, for example, ethyleneglycol, glycerin, sorbitol, trimethylolpropane, (poly)propylene glycol, and the like.

The above-mentioned isocyanate is not particularly limited when it is bi- or higher-functional and may include, for example, isophorone diisocyanate, 2,4-tolylene diisocyanate, 2,6-tolylene diisocyanate, hexamethylene diisocyanate, trimethylhexamethylene diisocyanate, diphenylmethane-4,4'-diisocynate (MDI), hydrogenated MDI, polymeric MDI, 1,5-naphthalene diisocyanate, norbornane diisocyanate, tolidine diisocyanate, xylylene diisocyanate (XDI), hydrogenated XDI, lysine diisocyanate, triphenylmethane triisocyanate, tris(isocyanatophenyl)thiophosphate, tetramethylxylene diisocyanate, 1,6,10-undecane triisocyanate and the like.

The above-mentioned hydroxyl group-containing (meth)acrylic monomer is not particularly limited and may include, for example, as a monomer having one hydroxyl group in a molecule, hydroxyethyl (meth)acrylate, hydroxypropyl (meth)acrylate, hydroxybutyl (meth)acrylate, and the like, and as a monomer having two or more hydroxyl groups in a molecule, epoxy(meth)acrylate, such as bisphenol A-modified epoxy(meth)acrylate. They may be used alone or in combination of two or more of them.

The mixing ratio of the epoxy groups and the (meth) acrylic groups in the curing resin composition is preferably acryl:epoxy=4:6 to 9:1. When the equivalent ratio of the (meth)acrylic groups is less than 4, the photoreactivity is deteriorated and therefore, not only the initial temporal curing cannot be carried out even by light radiation to a sealant after gap adjustment but also the elusion to a liquid crystal may become large. When it is more than 9, the adhesion strength and the moisture permeability become insufficient. It is more preferably 5:5 to 8:2.

It is preferable that the above-mentioned compound having at least one (meth)acryl group and epoxy group each has a hydroxyl and/or a urethane bond in terms of low affinity with a liquid crystal and elimination of pollution.

It is preferable that the above-mentioned compound having at least one (meth)acryl group and epoxy group each has at least one molecular skeleton selected from biphenyl skeleton, naphthalene skeleton, bisphenol skeleton and novolak skeleton. Accordingly, the heat resistance of the curing resin composition of the invention can be improved.

The above-mentioned compound having at least one (meth)acryl group and epoxy group each preferably has a number average molecular weight of 300 or higher. When it is less than 300, elution to a liquid crystal and orientation disorder of the liquid crystal are easily caused in some cases. The number average molecular weight is preferably 3,000 or lower. When it is more than 3,000, it becomes difficult to adjust the viscosity in some cases.

In the case where the above-mentioned compound having at least one (meth)acryl group and epoxy group each is used as a curing resin, an absorption peak of a carbonyl group derived from the (meth)acryl group can be observed when an IR absorption spectrum is measured after curing of the curing resin composition of the first invention. Further, in the case where an epoxy group and a hydroxyl group derived from an epoxy group exist, their peaks can be also observed.

The above-mentioned photopolymerization initiator is not particularly limited if it is capable of polymerizing curing compound components by light radiation, however when the following photopolymerization initiator of the third invention is used, elution of the photopolymerization initiator to a liquid crystal can be prevented and therefore it is preferable.

The third invention is a photopolymerization initiator having a reactive double bond and a photoreaction starting site. The photopolymerization initiator of the third invention can provide sufficient reactivity if it is added to the curing resin composition of the first or the second invention and the initiator is not eluted to a liquid crystal and thus does not pollute the liquid crystal. Above all, benzoin (ether) compounds having reactive double bond together with hydroxyl groups and/or urethane bond are preferable. Incidentally, benzoin (ether) compounds include benzoins and benzoin ethers.

As the above-mentioned reactive double bond, residues such as allyl, a vinyl ether, (meth)acryl group can be exemplified and in the case of using it as a photopolymerization initiator for a sealant or an end-sealing material, the (meth)acryl residue is preferable because of high reactivity. Owing to possession of such a reactive double bond, the weathering resistance can be improved in the case of adding it to a sealant or an end-sealing material.

The above-mentioned benzoin (ether) compounds may have either one or both of hydroxyl group and urethane bond. When the benzoin (ether) compounds have neither hydroxyl group nor urethane bond, in the case of adding them to a sealant or an end-sealing material, they are possibly eluted to a liquid crystal before curing in some cases.

With respect to the above-mentioned benzoin (ether) compounds, although the foregoing reactive double bond as well as the hydroxyl group and/or the urethane bond may be located at any site of the benzoin (ether) skeleton, those having a molecular skeleton defined by the following general formula (4) are preferable. When a compound having such a molecular skeleton is used as a photopolymerization initiator, the residual substances can be lessened and the amount of the out gas can be suppressed.

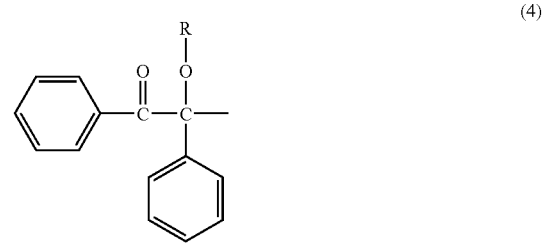

(4)

In the formula, R represents hydrogen or an aliphatic hydrocarbon residue with 4 or less carbon atoms. When R represents an aliphatic hydrocarbon residue with more than 4 carbon atoms, the storage stability is increased in the case of adding it to a photopolymerization initiator, the reactivity is possibly decreased owing to the steric hindrance of the substituent group in some cases.

The benzoin (ether) compounds having a molecular skeleton defined by the general formula (4) may include, for example, but compounds defined by the following general formula (5).

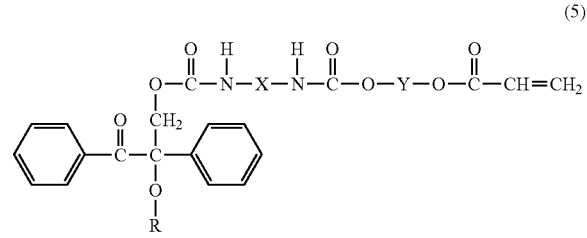

(5)

In the formula, R represents hydrogen or an aliphatic hydrocarbon residue with 4 or less carbon atoms; X represents a bifunctional isocyanate derivative residue with 13 or less carbon atoms; Y represents an aliphatic hydrocarbon residue with 4 or less carbon atoms or residue with 3 or lower atomic ratio of carbon and oxygen composing the residue. When X is a bifunctional isocyanate derivative residue with more than 13 carbon atoms, dissolution in a liquid crystal easily occurs in some cases. When Y is an aliphatic hydrocarbon residue with more than 4 carbon atoms or residue with more than 3 atomic ratio of carbon and oxygen composing the residue, dissolution in a liquid crystal easily occurs in some cases.

As a photopolymerization initiator, one or more of the following other compounds may be used in combination; benzophenone, 2,2-diethoxyacetophenone, benzyl, benzoyl isopropyl ether, benzyl dimethyl ketal, 1-hydroxycyclohexyl phenyl ketone, thioxanthone and the like.

The amount of the above-mentioned photopolymerization initiator to be added is preferably 0.1 to 10 parts by weight to 100 parts by weight of a curing resin. When it is less than 0.1 parts by weight, the capability of starting photopolymerization is sometimes insufficient to cause an effect and when it is more than 10 parts by weight, a large quantity of the photopolymerization initiator possibly remains being unreacted and it may result in deterioration of the weathering resistance. The amount to be added is more preferably 1 to 5% by weight.

The above-mentioned curing agent is for causing reaction and cross-linking of the epoxy groups and/or the acryl groups in the curing resin composition by heating and takes a roll to improve the adhesion strength and the humidity resistance of the curing resin composition after curing. As the curing agent, a latent curing agent with a melting point of 100° C. or higher can be preferably used. When a curing agent having a melting point of 100° C. or lower is used, it is possible in some cases that the storage stability is considerably deteriorated.

The curing agent may include, for example, hydrazido compounds such as 1,3-bis[hydrazinocarbonoethyl-5-isopropylhydantoin]; dicyandiamide; guanidine derivatives; imidazol derivatives such as 1-cyanoethyl-2-phenylimidazole, N-[2-(2-methyl-1-imidazolyl)ethyl]urea, 2,4-diamino-6-[2'-methylimidazolyl-(1')]ethyl-s-triazine, N,N'-bis(2-methyl-1-imidazolylethyl)urea, N,N'-(2-methyl-1-imidazolylethyl)adipoamide, 2-phenyl-4-methyl-5-hydroxymethylimidazole, 2-phenyl-4,5-dihydroxymethylimidazole, and the like; modified aliphatic polyamines; acid anhydrides such as tetrahydrophthalic anhydride, ethyleneglycol bis(anhydrotrimellitate) and the like; and adducts of various amines and epoxy resins. They may be used alone or two or more of them in combination.

In the case of using an acrylic acid-modified epoxy resin as the above-mentioned compound having at least one (meth)acryl group and epoxy group each in a molecule, the reactivity of the acryl-epoxy resin considerably changes based on the structure and in the case of a urethane-modified epoxy resin, owing to its stability, the storage stability is excellent even if a highly reactive curing agent is used, meanwhile in the case of the (meth)acrylic acid-modified epoxy resin, the reactivity is high and therefore, a curing agent having a melting point of 100° C. or higher and low reactivity is preferable in terms of the storage stability.

The mixing ratio of the above-mentioned curing agent is preferably 5 to 60 parts by weight, more preferably 10 to 50 parts by weight, to 100 parts by weight of a curing compound. When it is out of the above-mentioned range, the adhesion strength and the chemical resistance of a cured product are sometimes decreased and the characteristics of a liquid crystal may be deteriorated quickly in a high temperature and high humidity operation test in some cases.

Further, as the above-mentioned curing agent, the following coated curing agent of the fourth invention is suitable. When the coated curing agent of the fourth invention is used as the curing agent, remarkably high storage stability can be obtained even in the case of one-liquid type.

The fourth invention is the coated curing agent wherein surface of a solid curing agent particle is coated with microparticles.

From the results of investigations, inventors of the invention have found that a curing resin composition with high storage stability can be obtained by employing a coated curing agent that is a solid curing agent whose surface is coated with microparticles scarcely volatile and scarcely dissolved in an organic compound even if a curing agent is added previously.

In this description, the above-mentioned solid curing agent means a curing agent in a solid state at a room temperature and which is melted or softened by heating to start reaction with a curing resin. Such a solid curing agent is not particularly limited if it has a melting point or a softening point at a room temperature or higher and for example, a solid amine compound, a phenol type compound, and an acid anhydride can be exemplified. Above all, a solid amine compound is preferable because it is excellent in the reactivity at a low temperature.

The above-mentioned solid amine compound means solid-state compounds having one or more primary to tertiary amino groups in a molecule and for example, aromatic amines such as methaphenylenediamine, diaminodiphenylmethane; imidazole compounds such as 2-methylimidazole, 1,2-dimethylimidazole, 1-cyanoethyl-2-methylimidazole; imidazoline compounds such as 2-methylimidazoline; and dihydrazide compounds such as sebacic acid dihydrazide, isophthalic acid dihydrazide can be exemplified. Commercialized products as the solid-state amine compounds are, for example, amine adducts such as Amicure PN-23 and Amicure MY-24 (both produced by Ajinomoto Fine Techno Co., Inc.); dicyandiamides.

As the above-mentioned polyhydric phenol-type compounds, for example, polyphenol compounds, novolak type phenol resins and the like can be exemplified. Commercialized products as the polyhydric phenol-type compounds are, for example, Epikure 170, Epikure YL 6065, and Epikure MP402FPI (all produced by Japan Epoxy Resin Co., Ltd.).

The above-mentioned acid anhydride may include, for example, glycerin bis(anhydrotrimellitate), ethyleneglycol bis(anhydrotrimellitate), tetrahydrophthalic anhydride, hexahydrophthalic anhydride, 4-methylhexahydrophthalic anhydride, 3-methyltetrahydrophthalic anhydride, and the like. Among these acid anhydrides, commercialized ones are, for example, Epikure YH 306 and YH 307 (both produced by Japan Epoxy Resin Co., Ltd.).

The average particle diameter of the above-mentioned solid curing agent particle is not particularly limited, however it is preferably 0.1 to 50 μm. When it is smaller than 0.1 μm, the surface cannot be coated efficiently with the microparticles in some cases and when it is larger than 50 μm, the curing agent is sometimes precipitated during the storage or uneven curing occurs in some cases in the case where such curing agent particles are added to a curing resin composition. It is more preferably 0.5 to 10 μm.

As microparticles for coating surface of the above-mentioned solid curing agent particles, oxides, hydroxides, halides of Si, Al, Ti, Fe, Mn, Mg and the like, styrene beads, finely granular rubber and the like may be used. These microparticles may be used solely or in combination of two or more of them.

The average particle diameter of the above-mentioned microparticle is preferably 0.05 μm or smaller. When it is more than 0.05 μm, the particles cannot efficiently coat the surface of the solid curing agent particles in some cases. It is more preferably 0.03 μm or smaller. The particle diameter of the microparticle is also preferably at largest 10% of that of the solid curing agent particles. When it is more than 10%, the capability of controlling the reactivity cannot be exhibited sufficiently in some cases.

The weight ratio of the solid curing agent particles to the microparticles is preferably 3:1 to 50:1. When the weight ratio of the solid curing agent particles is more than 50, the capability of controlling the reactivity cannot be exhibited sufficiently in some cases and when it is less than 3, microparticles exist excessively to result in deterioration of the curing function in some cases. It is more preferably 5:1 to 20:1.

The method for coating surface of the solid curing agent particles with the microparticles is not particularly limited and for example, a method of mixing solid curing agent particles and microparticles in a container by a commercialized blender and making the mixture uniform or the like can be exemplified.

The amount of the coated curing agent of the fourth invention in the curing resin composition to be added is preferably 1 to 100 parts by weight to 100 parts by weight of the curing resin composition. When it is less than 1 part by weight, sufficient curing cannot be carried out in some cases and when it is more than 100 parts by weight, since an excess amount of the curing agent remains, some physical properties such as toughness of cured products to be obtained may be sometimes deteriorated.

When being mixed with a curing resin to obtain a curing resin composition, the coated curing agent of the third invention shows high storage stability since the solid curing agent is kept from the curing resin as much as possible owing to the microparticles on the surface during the storage at a normal temperature and at the time of curing, the curing agent is brought into contact with the curing agent without being inhibited by the microparticles to quickly start the curing reaction by is heating and making the solid curing agent into a liquid. Accordingly, the storage stability of the curing resin composition is improved. The coated curing agent of the fourth invention can be very simply produced within a short time at a normal temperature without requiring a specific reaction.

It is preferable that the curing resin composition of the first and the second inventions further contain a silane coupling agent. The silane coupling agent takes a role as an adhesion assisting agent for excellently sticking mainly a sealant or an end-sealing material to a liquid crystal display element substrate. Further, the silane coupling agent may be used for a method for treating the surface of a filler with it in order to improve the mutual interaction between the resin composing the sealant or end-sealing material and an inorganic or organic filler to be added for improvement of the adhesion property based on the stress dispersion effects and improvement of the linear expansion ratio.

The fifth invention is a curing resin composition obtained by heating a silane compound having at least one functional group belonging to the following group A and at least one functional group belonging to the following group B and the curing resin composition of the first or the second invention.

Group A:

—OCH$_3$, —OC$_2$H$_5$

-continued

Group B:

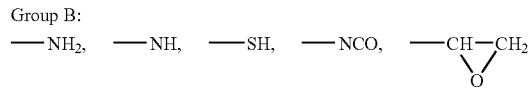

Practical examples of the above-mentioned silane compound are γ-aminopropyltrimethoxysilane, γ-mercaptopropyltrimethoxysilane, γ-glycidoxypropyltrimethoxysilane, γ-isocyanatopropyltrimethoxysialne, and the like. These silane compounds may be used solely or in combination of two or more of them.

Use of a silane compound with such a structure as a silane coupling agent enables the curing resin composition of the fifth invention to improve adhesion strength to a substrate and prevents the elution to a liquid crystal by the chemical bonding of the silane compound to the curing resin via the functional group belonging to the group B.

With respect to the curing resin composition of the fifth invention, after addition of the silane compound, heating is carried out. By the heating, the foregoing silane compound is chemically bonded with the curing resin component via the functional group belonging to the group B. It is preferable to carry out the above-mentioned heating under stirring of the resin mixture for improving the reaction efficiency. The stirring method is not particularly limited and a general method of rotating a stirrer or blades for stirring by a motor can be exemplified. The temperature of the heating treatment is preferably 30 to 70° C. When it is lower than 30° C., the reaction of the silane compound and the curing resin does not sufficiently occur in some cases and when it is more than 70° C., curing owing to the heat is possibly started. It is more preferably 40 to 60° C. The duration of the heating treatment is preferably 1 to 2 hours. When it is shorter than 1 hour, the functional groups of the silane compound do not necessarily react all and therefore, unreacted products may remain in some cases.

The remaining ratio of at least one functional group belonging to the above-mentioned group B after the heating treatment is 10% or lower. When it is more than 10%, they react on the resin component during storage to result in increase of the viscosity and pollution of the liquid crystal owing to flow to the liquid crystal. The remaining ratio of at least one functional group belonging to the above-mentioned group B can be calculated on the basis of the relative ratio of the intensity of the peaks of the respective functional groups in the silane compound and that after the heating treatment by $^1$H-NMR measurement.

The sixth invention is a silane coupling agent which comprises an imidazole silane compound having a bound structure between imidazole skeleton and alkoxysilyl group via a spacer group. The imidazole structure scarcely has reactivity on a curing resin at a storage temperature around a room temperature, however it shows reactivity on the curing resin by heating, so that the curing resin composition of the first or the second invention containing the silane coupling agent of the sixth invention is provided with the following properties all together: it is excellent in the adhesion force and the storage stability; it scarcely emits out gas; and it hardly pollutes a liquid crystal owing to scarce elution to the liquid crystal.

The above-mentioned imidazole silane compound may include, for example, those having the following general formula (6) and the following general formula (7).

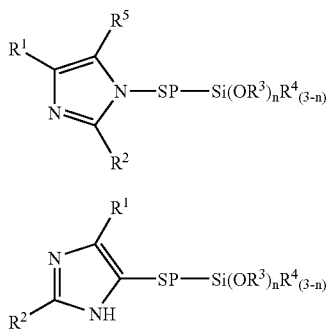
(6)

(7)

In the formula, $R^1$ to $R^5$ independently represents a hydrocarbon group, hydrogen, or a hydroxymethyl group. Above all, it is preferable that $R^1$ and $R^5$ independently represent a $C_{1-5}$ hydrocarbon group, hydrogen, hydroxymethyl group and more preferably represent hydrogen, methyl, vinyl, hydroxymethyl group or the like in terms of easiness of the synthesis. Further, $R^2$ is preferably a $C_{1-20}$ hydrocarbon group, hydrogen, or a hydroxymethyl and more preferably hydrogen, methyl, ethyl, undecyl, heptadecyl, phenyl or the like in terms of easiness of the synthesis. Further, $R^3$ and $R^4$ are preferably a $C_{1-3}$ hydrocarbon group, respectively, and more preferably hydrogen, methyl, ethyl or the like in terms of easiness of the synthesis. In the formula, -SP- represents a spacer group comprising a straight chain alkyl group or a branched alkyl group which may comprise ester group, ether group, carbonate group, urethane group, amido group, sulfone group, ketone group, an alkylene group or the like. Above all, in terms of suppression of elution to the liquid crystal, urethane group is preferably introduced. Further, in terms of suppression of elution to the liquid crystal, some of hydrogen atoms of the spacer group are preferably substituted with high polar functional groups with high polarity and as such substituent groups, for example, halogen atoms, hydroxyl groups, mercapto groups, carboxyl groups, amino groups and the like can be exemplified. Further, the spacer group defined as -SP- preferably comprises 1 to 20 atoms composing its main chain. When it is less than 1, the boiling point is decreased and an out gas is easily emitted, resulting in occurrence of liquid crystal pollution in some cases, and when it is more than 20, the viscosity becomes high to make handling of the obtained curing resin composition difficult and since the alkoxysilane equivalent amount decreases, the effect may scarcely be exhibited unless the amount to be added is increased. It is more preferably 3 to 10.

Compounds defined by the above-mentioned general formula (6) or general formula (7) may partly include, for example, those defined by the following general formula (8) or the following general formula (9).

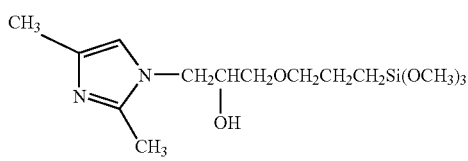
(8)

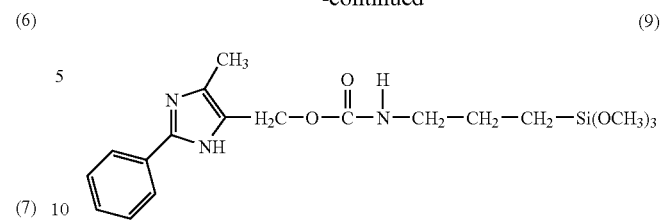
(9)

A method for producting the compounds defined by the above-mentioned general formula (8) may be a method of causing reaction of, for example, 2,4-dimethylimidazole and γ-glycidoxypropyltrimethoxysilane. On the other hand, a production method of the compounds defined by the above-mentioned general formula (9) may be a method of causing reaction of, for example, 2-phenyl-3-methyl-5-hydroxymethylimidazole and γ-isocyanatopropyltrimethoxysialne.

The amount of the imidazole silane compound of the sixth invention in the curing resin composition to be added is preferably 0.1 to 15 parts by weight to 100 parts by weight of a curing resin. When it is less than 0.1 parts by weight, sufficient adhesion force cannot be provided and when it is more than 15 parts by weight, the storage stability may be decreased in some cases.

The curing resin compositions of the first and the second inventions preferably contain a filler surface treated with at least one of compounds selected from imidazole silane compounds comprising imidazole skeleton and an alkoxysilyl group bonded to each other via a spacer group, epoxysilane compounds, and aminosilane compounds. Addition of the filler provides an effect to improve the adhesion properties owing to the stress dispersion effect and improve the linear expansion ratio. Further, surface treatment of the filler with a silane coupling agent such as imidazole silane compounds comprising imidazole skeleton and an alkoxysilyl group bonded to each other via a spacer group, epoxysilane compounds, and aminosilane compounds can increase the affinity of the filler with a curing resin and at the same time such a silane coupling agent is not eluted to a liquid crystal or does not pollute the liquid crystal.

The above-mentioned filler is not particularly limited and may include, for example, inorganic fillers such as silica, diatomaceous earth, alumina, zinc oxide, iron oxide, magnesium oxide, tin oxide, titanium oxide, magnesium hydroxide, aluminum hydroxide, magnesium carbonate, barium sulfate, gypsum, calcium silicate, talc, glass beads, sericite activated clay, bentonite, aluminum nitride, silicon nitride and the like and organic fillers such as polyester microparticles, polyurethane microparticles, vinyl polymer microparticles, rubber microparticles.

The shape of the above-mentioned filler is not particularly limited and may have a regular shape such as spherical, needle-like, plate-like or may be amorphous.

The amount of the imidazole silane compound to be used for the treatment of the filler is preferably 0.05 to 5 parts by weight of the imidazole silane to 100 parts by weight of the filler. When it is less than 0.05 parts by weight, the surface treatment cannot be carried out sufficiently to result in an insufficient effect on the curing resin and when it is more than 5 parts by weight, the filler is agglomerated by the excess amount of the imidazole silane to make it difficult to handle the obtained curing resin composition. It is more preferably 0.1 to 1 part by weight.

A surface treatment method of the above-mentioned filler is not particularly limited and may include, for example, a method of causing a reaction of a filler with a solution obtained by dissolving and hydrolyzing an imidazole silane compound or the like in water with a specified pH (acidic).

The amount of the filler surface-treated with the above-mentioned imidazole silane compound to be added is preferably 5 to 100 parts by weight to 100 parts by weight of the curing resin. When it is less than 5 parts by weight, the effect such as improvement of the adhesion property owing to the stress dispersion effect or improvement of the linear expansion ratio cannot be sufficiently exhibited in some cases and when it is more than 100 parts by weight, the viscosity considerably increases in some cases. It is more preferably 10 to 50 parts by weight.

In order to remove the ionic impurities from a curing resin composition of the invention and satisfy the above-mentioned characteristics, a curing resin composition is preferably produced by a curing resin composition production method of the following seventh invention.

The seventh invention is a method for producing curing resin composition involving a step 1 of bringing an ion adsorptive solid and a curing resin composition into contact with each other and a step 2 of separating the ion adsorptive solid from the curing resin composition.

The above-mentioned ion adsorptive solid is not particularly limited if it is a substance capable of adsorbing an ionic impurity existing in an adhesive and is preferably a compound defined by the following general formula (10)

$$X_m Y_n (Z_p O_q) W_r \cdot sH_2O \tag{10}$$

In the formula, X represents $Na^+$, $K^+$, or $Ca^{2+}$; Y represents $Mg^{2+}$, $Fe^{2+}$, $Al^{3+}$, $Fe^+$, $Ti^{4+}$, or $Mn^{2+}$; Z represents $Si^{4+}$, or $Al^{3+}$; W represents $OH^-$, $Cl^-$, $F^-$, $CO_3^{2-}$; m, n, p, q, r, and s separately represent an integer not lower than 0. Further, m, n, p, q, r, and s preferably satisfy the following equation (11).

$$2q + ra = ma + na + pa \tag{11}$$

In the formula, ra, ma, na, and pa respectively represent the values calculated by multiplying r, m, n, and p with the electric charge of ions in the above-mentioned general formula (10).

As the ion adsorptive solid, those containing aluminum element are preferable and those containing $Al^{3+}$ are more preferable. The content of $Al^{3+}$ referably satisfies 5 to 80% by mole of $Al^{3+}$ in the total ion atoms of Y and Z in the above-mentioned general formula (10). When it is less than 5% by mole, the ion adsorption amount is sometimes decreased and when it is more than 80% by mole, $Al^{3+}$ is sometimes eluted easily.

As the ion adsorptive solid, a lamellar inorganic compound is preferably used. The lamellar inorganic compound is a compound having lamellar structural units having specified properties and owing to the interval structure, the compound is excellent in the designing capability and function-providing properties and such a compound has particular properties and functions such as second-dimensional physical properties and ion exchange capability.

Use of such a lamellar inorganic compound makes it possible to trap an ionic impurity by the metal atoms existing in the interlayers of the lamellar inorganic compound and owing to the lamellar structure, the ionic impurity once trapped and adsorbed is hardly eluted again.

The above-mentioned lamellar inorganic compound is preferably a lamellar silicate mineral.

The above-mentioned lamellar silicate mineral may include, for example, hydrotalcite-group compounds, serpentine-kaolin-group compounds, talc-pyrophyllite-group compounds, smectite-group compounds, vermiculite-group compounds, mica-group, interlayer-deficient mica compounds, brittle mica-group compounds, chlorite-group compounds, interstratified minerals, diatomaceous earth, aluminum silicate and the like. Hydrotalcite-group compounds and serpentine-group compounds are preferable. Above all, those with an aluminum element content in the above-mentioned range are more preferable and hydrotalcite-group compounds and serpentine-kaolin-group compounds with an aluminum element content in the above-mentioned range are further more preferable. The above-mentioned lamellar silicate minerals may be natural minerals or synthesized minerals. These lamellar silicate minerals may be used solely or in combination to two or more of them.

As the above-mentioned hydrotalcite-group compounds, those defined by the following general formulas (12) are preferable and among then, $Mg_6Al_2(OH)_{16}CO_3 \cdot 4H_2O$ is desirable.

$$Mg_{n1}Al_{n2}(OH)_{r1}(CO_3)_{r2} \cdot sH_2O \tag{12}$$

In the formula, n1, n2, r1 and r2 independently represent an integer not lower than 1; in relation to the above-mentioned general formulas (10) and (11), n=n1+n2 and r=r1+r2.

The serpentine-kaolin-group compounds may include, for example, lizardite, berthierine, amesite, cronstedtite, neopouite, kellyite, fraiponite, brindlleyite, kaolinite, dickite, nacrite, halloysite (planar), odinite, and the like.

The above-mentioned talc-pyrophillite-group compounds may include, for example, talc, willemsite, kerolite, pimelite, pyrophyllite, ferripyrophyllite, and the like.

The above-mentioned smectite-group compounds may include, for example, saponite, hectorite, sauconite, stevensite, swinefordite, montmorillonite, beidellite, nontronite, volkonskoite and the like.

The above-mentioned vermiculite-group minerals may include, for example, trioctahedral vermiculite, dioctahedral vermiculite and the like.

The above-mentioned mica-group compounds may include, for example, biotite, phologopite, annite, eastonite, siderophyllite, tetraferriannite, lepidolite, polylithionite, muscovite, celadonite, ferro-celadonite, ferro-aluminoceladonite, aluminoceladonite, tobelite, paragonite and the like.

The above-mentioned interlayer deficient mica-group minerals may include, for example, dioctahedral type illite, glauconite, brammallite, triaoctahedral type (wonesite), and the like.

The above-mentioned brittle mica group-minerals may include, for example, clintonite, kinoshitalite, bityite, anandite, margarite and the like.

The above-mentioned chlorite-group minerals may include, for example, chlonichlore, chamosite, pennantite, nimite, baileychlore, donbassite, cookeite, sudoite, and the like.

The interstratified minerals may include, for example, corrensite, hydrobiotite, aliettite, kulkeite, rectorite, tosudite, dozylite, lunijianlite, saliotite and the like.

The above-mentioned ion adsorptive solid is preferably a granular solid so as to be easily separated from the curing resin composition after contact with each other. The shape of the above-mentioned ion adsorptive solid is not particularly limited and the particle diameter is preferably small for the purpose to increase the contact opportunity with the ionic impurity to be collected. To avoid the problem of clogging at the time of filtration, it is preferably 2 μm or larger.

The curing resin composition production method of the invention comprises a step 1 of bringing the above-mentioned ion absorptive solid and a curing resin composition into contact with each other and a step 2 of separating the ion absorptive solid and the curing resin composition from each other.

In the step 1, the method for bringing the ion absorptive solid and the curing resin composition into contact with each other is not particularly limited and may be carried out by mixing them using a stirring apparatus, a planetary type stirring apparatus, a primary mixer or the like or filling a column with the ion adsorptive solid and passing the curing resin composition through the column. Further, in the step 1, the ion adsorptive solid and the curing resin composition are preferably brought into contact with each other while being heated at 40 to 100° C. When it is lower than 40° C., the surface activity of the ion-exchange solid is hardly increased and ionic impurities are scarcely removed in some cases. When it is higher than 100° C., the object curing resin composition sometimes becomes viscous. It is more preferably 60 to 80° C. Incidentally, in the case where the ion adsorptive solid and the curing resin composition are brought into contact with each other by a mixing method, the amount of the ion adsorptive solid to be added should be properly selected depending on the amounts and the types of ionic impurities, however it is preferably 2 to 20 parts by weight to 100 parts by weight of the curing resin composition. When it is less than 2 parts by weight, the capability of adsorbing ionic impurities becomes insufficient to cause a desirable effect in some cases and when it is more than 20 parts by weight, the ion adsorptive solid is not only in excess and consumed in vain but also the viscosity of the resulting mixture becomes high and therefore filtration takes a long time. It is more preferably 7 to 15 parts by weight.

In the above-mentioned step 2, the method for separating the above-mentioned ion adsorptive solid and curing resin composition is not particularly limited and for example, filtration, centrifugal separation or the like can be exemplified.

The curing resin composition production method of the seventh invention preferably comprises steps of recovering and refining the ion adsorptive solid after the ion adsorptive solid and the curing resin composition are mixed so as to remove the ionic impurities. If the ion adsorptive solid is not recovered and is left as it is, the refined ionic impurities may be possibly eluted again in a weathering test at a high temperature and a high humidity.

Ionic impurities such as sodium ion, potassium ion, chlorine ion, acrylic acid, methacrylic acid and the like are removed from the curing resin composition produced by the curing resin composition production method of the seventh invention and thus their elution to the liquid crystal is prevented.

The eighth invention is a sealant for a display element using the curing resin composition of the invention and the ninth invention is an end-sealing material for a display element using the curing resin composition of the invention.

The sealant for a display element of the eighth invention and the end-sealing material for a display element of the ninth invention comprise the curing resin composition of the first invention, so that they are exceedingly excellent in the storage stability and their components do not pollute the liquid crystal owing to the elution to the liquid crystal before and after curing.

The method for fabricating a display element using the sealant for a display element of the eighth invention or the end-sealing material for a display element of the ninth invention is not particularly limited and for example, it can be fabricated by the following method.

At first, the sealant for a liquid crystal display element of the seventh invention is applied in prescribed pattern to one of two electrode-bearing transparent substrates (of inorganic glass or plastic plates) of ITO thin layers or the like in such a manner that a liquid crystal injection inlet is opened. As an application method, screen printing, a dispenser coating and the like can be employed. The two resulting transparent substrates are set face to face to sandwich a spacer between them and layered on each other while being properly positioned. After that, UV rays are radiated to the sealing part of the transparent substrates to temporarily stick them to each other and further heating at 100 to 200° C. for 1 hour in an oven is carried out to thermally cure the sealant and complete the curing. Finally, a liquid crystal is injected through the liquid crystal injection inlet and the injection inlet is closed by using the sealant for a liquid crystal display element of the invention to fabricate a liquid crystal display cell.

Further, a liquid crystal display element fabrication method by one drop fill process is carried out as follows; for example, at first the sealant for a liquid crystal display element of the seventh invention is applied in a rectangular seal pattern to one of two electrode-bearing transparent substrates of ITO thin layers or the like by screen printing, a dispenser coating or the like. Then, fine droplets of a liquid crystal is dropwise applied to the entire face in the frame while the sealant being kept in an uncured state and immediately the other transparent substrate is overlaid and UV rays are radiated to the sealing part to temporarily stick the substrates to each other. After that, heating is carried out at the time of the liquid crystal annealing to actually carry out curing and fabricate a liquid crystal display element.

A display apparatus fabricated using the sealant for a display element of the eighth invention or the end-sealing material for a display element of the ninth invention is also one invention.

Figure 3:
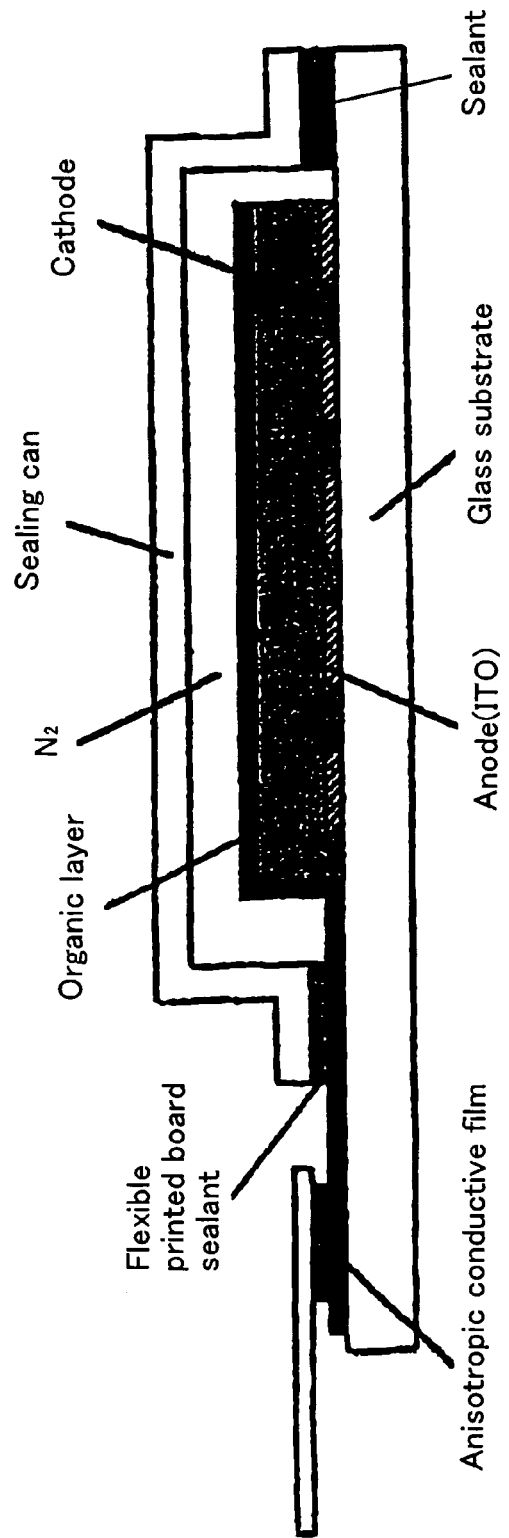
FIG. 3 is a schematic figure illustrating the structure of organic EL display.

The curing resin composition of the invention can be used also for a sealant for attaching a sealing can in organic EL display fabrication. FIG. 3 is a schematic figure showing an organic EL display.

Since an organic EL display comprises film faces formed using a low molecular weight organic material susceptible to water and high energy particles, a sealing can made of a metal, glass, a metal evaporated film, or the like is required so as to cover the film faces formed by film formation. In this case, the process before the attachment of the sealing can is performed in vacuum, and at the time of attachment of the sealing can, the inside of the sealing can is purged with nitrogen to eliminate difference between the inside pressure and the outside pressure and thus to prevent penetration of the inside with atmospheric air and accordingly with water. For example, the sealing can may be stuck in such a manner that a mask is formed by evaporating aluminum on a single glass substrate so as to shield light rays from a film face of a light emitting layer and UV rays are thus allowed to pass only the pattern part of the sealant. Next, the glass substrate and the sealing can are stuck to each other by a sealant to complete sealing. Accordingly, the sealant is required to be resistant to humidity penetration.

Figure 2:
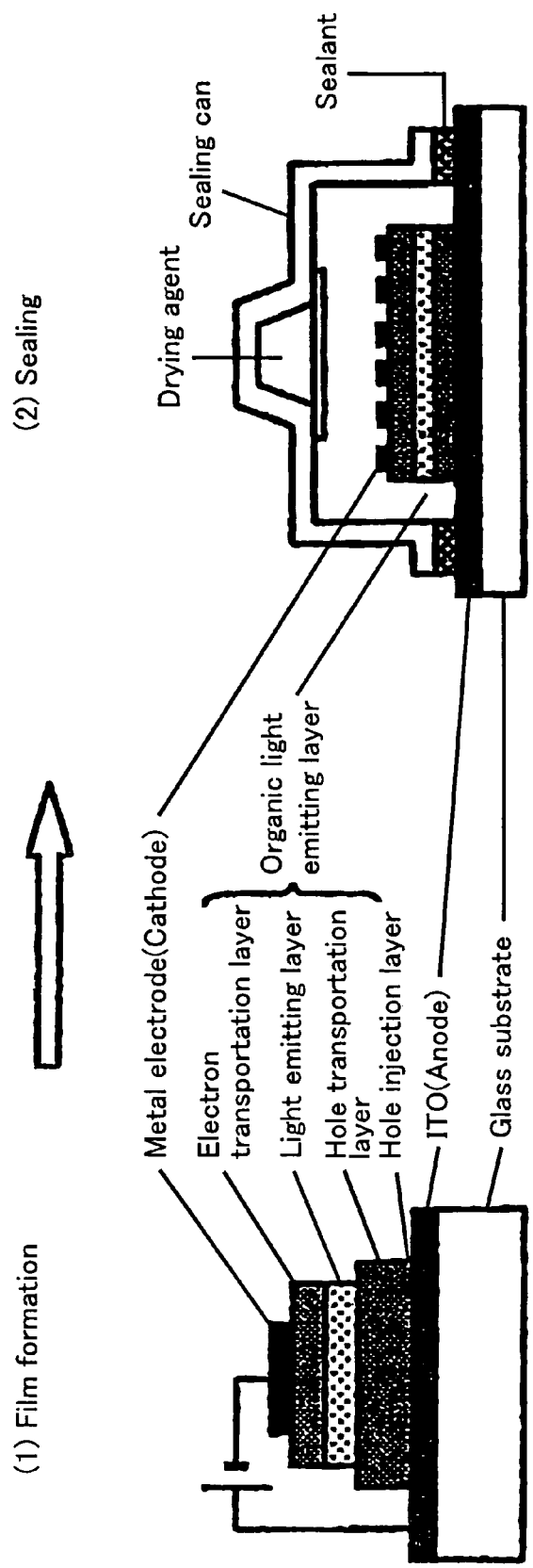
FIG. 2 is a schematic figure illustrating the formation of an organic light emitting layer in an organic EL display fabrication.

Next, an organic EL display fabrication method will be summarized. A substrate to be used is a substrate having a film face in which switching elements of TFT or the like are formed and an ITO film formed by sputtering on the uppermost surface. At first, for the pretreatment for adjusting the joining surface potential and a hole layer surface potential, ozone is generated in the substrate by vacuum UV rays from a UV light source to oxidize the transparent electrode surface of the ITO thin layer formed on the glass substrate. Next, formation of a light emitting display layer will be described with reference to FIG. 1. CVD sputtering is carried out so as to surround the peripheral part of the ITO film with a $SiO_2$ film. A wall surrounding the light emitting display layer to be a sub-pixel and made of a PI film is formed on $SiO_2$ film. Hereinafter, the organic light emitting layer will be described with reference to FIG. 2(1). The organic light emitting layer is to be formed on the substrate, and since the treatment should be carried out while being kept from atmospheric air from this step to the step of sealing the light emitting layer, a series of the steps are carried out in nitrogen atmosphere or in vacuum. At first, a film of a positive hole injection layer is formed on the ITO film using an aromatic amine type material. Further, a positive hole transportation layer of a diamine derivative is formed thereon by ink jet printing and cross-linked by heating, and a light emitting layer is formed further thereon similarly by ink jet printing and heated and fired in nitrogen atmosphere. An Alq3, which is an electron transportation light emitting material, is evaporated and layered thereon and further an Al—Li as a cathode is formed by evaporation to complete film formation. After that, sealing process for attaching a sealing can for shutting the formed layers from atmospheric air to the film-bearing substrate is started. At first, a sealant is applied to the sealing can for shutting water and other energy by a dispenser. The application conditions at that time are same as those in the case of liquid crystal panel fabrication and the sealing material is applied without any interval to surround the peripheral part of the sealing can. For defoaming of foams contained in the sealant, together with the sealing can, the sealant is subjected to vacuum defoaming in atmosphere with 0.1 Pa vacuum degree and then sticking step is to be carried out. In such process, in order to carry out the sealing in the condition of shutting out the atmospheric air, the sealing can is stuck so as to surround the organic light emitting layer on the film-bearing substrate in nitrogen atmosphere and thus the organic EL display is fabricated.

BEST MODE FOR CARRYING OUT THE INVENTION

Hereinafter, the invention will be described further in details with reference to Examples, however it is not intended that the invention be limited to the illustrated Examples.

(A) Synthesis of Acrylic Acid-Modified Phenol Novolak Epoxy Resin

A liquid phase phenol novolak type epoxy resin (D.E.N.431, produced by Dow Chemical Co.) 1,000 parts by weight, p-methoxyphenyl as a polymerization inhibitor 2 parts by weight, triethylamine as a reaction catalyst 2 parts by weight, and acrylic acid 200 parts by weight were reacted at 90° C. for 5 hours under stirring and refluxing conditions while sending air. The obtained resin 100 parts by weight was filtered through a column filled with a natural bonded product of quartz and kaolin (Sillitin V 85, produced by Hoffmann-Mineral GmbH & Co.) 10 parts by weight to adsorb ionic impurities in the reaction products and obtain an acrylic acid-modified phenol novolak epoxy resin (50% partly acrylated product).

(B) Synthesis of Acrylic Acid-Modified Propylene Oxide Bisphenol A Epoxy Resin

A liquid phase polyoxyalkylene bisphenol A diglycidyl ether (EP 4000 S, produced by Asahi Denka Kogyo K.K.) 1,440 parts by weight, p-methoxyphenol as a polymerization inhibitor 2 parts by weight, triethylamine as a reaction catalyst 2 parts by weight, and acrylic acid 200 parts by weight were reacted at 90° C. for 5 hours under stirring and refluxing conditions while sending air. The obtained resin 100 parts by weight was filtered through a column filled with a natural bonded product of quartz and kaolin (Sillitin V 85, produced by Hoffmann-Mineral GmbH & Co.) 10 parts by weight to adsorb ionic impurities in the reaction products and obtain an acrylic acid-modified propylene oxide bisphenol A epoxy resin (50% partly acrylated product).

(C) Synthesis of Urethane-Modified Partly Acrylated compound

Trimethylolpropane 134 parts by weight, BHT as a polymerization initiator 0.2 parts by weight, dibutyl tin dilaurate as a reaction catalyst 0.01 parts by weight, and isophorone diisocyanate 666 parts by weight were added and reacted at 60° C. for 2 hours under stirring and refluxing conditions. Next, 2-hydroxyethyl acrylate 25.5 parts by weight and glycidol 111 parts by weight were added and while sending air, reaction was carried out at 90° C. for 2 hours under stirring and refluxing conditions. The obtained resin 100 parts by weight was filtered through a column filled with a natural bonded product of quartz and kaolin (Sillitin V 85, produced by Hoffmann-Mineral Co.) 10 parts by weight to adsorb ionic impurities in the reaction products and obtain a urethane-modified partly acrylated compound.

EXAMPLE 1

A curing resin composition comprising the acrylic acid-modified phenol novolak epoxy resin obtained as (A) 40 parts by weight, the urethane-modified partly acrylated compound obtained as (C) 20 parts by weight, and a hydrazide type curing agent as a latent thermosetting agent (Amicure VDH, produced by Ajinomoto Fine Techno Co., Inc.) 15 parts by weight, a photopolymerization initiator 2,2-diethoxyacetophenone 1 part by weight, silica particles (average particle diameter of 1.5 µm) 23 parts by weight, and γ-glycidoxypropyltrimethoxysilane 1 part by weight was sufficiently mixed by three rolls so as to be a uniform liquid to obtain a sealant.

The obtained sealant was applied to one of two transparent electrode-bearing transparent substrates by a dispenser in such a manner as to draw a rectangular frame. Successively, fine droplets of a liquid crystal (JC-5004 LA, produced by Chisso Corporation) are dropwise applied to the entire face of the inside of the frame of the transparent substrate and immediately the other transparent substrate was overlaid and UV rays with intensity of 50 mW/cm² were radiated to the sealed part for 60 seconds by using a high pressure mercury lamp. After that, liquid crystal annealing was carried out at 120° C. for 1 hour for thermal curing to fabricate a liquid crystal display cell.

EXAMPLE 2

A sealant was obtained in the same manner as Example 1, except that partly acrylated propyleneoxide product obtained as (B) 20 parts by weight was used in place of the urethane-modified partly acylated product obtained as (C) 20 parts by weight and a hydrazide type curing agent (NDH, produced by Japan Hydrazine Co., Inc.) 15 parts by weight was used in place of the hydrazide type curing agent (Amicure VDH, produced by Ajinomoto Fine Techno Co., Inc.) 15 parts by weight and using the sealant, a liquid crystal display cell was fabricated.

COMPARATIVE EXAMPLE 1

A curing resin composition containing urethane acrylate (AH-600, produced by Kyoeisha Chemical Co., Ltd.) 35 parts by weight, 2-hydroxybutyl acrylate 15 parts by weight, isobornyl acrylate 50 parts by weight, and benzophenone 3 parts by weight was mixed so as to be a uniform liquid and obtain a photocuring type sealant and using the sealant, a liquid crystal display cell was fabricated.

COMPARATIVE EXAMPLE 2

A curing resin composition containing the acrylic acid-modified phenol novolak epoxy resin (A), which was not filtered through a column, 35 parts by weight, 2,2-diethoxy-acetophenone 1 part by weight, bisphenol A epoxy resin (Epikote 828, produced by Japan Epoxy Resin Co., Ltd.) 25 parts by weight, a hydrazide type curing agent (NDH, produced by Japan Hydrazine Co., Inc.) 15 parts by weight, silica particles (average particle diameter of 1.5 μm) 23 parts by weight, and γ-glycidoxypropyltrimethoxysilane 1 part by weight was sufficiently mixed by three rolls so as to be a uniform liquid to obtain a sealant and using the sealant, a liquid crystal display cell was fabricated.

COMPARATIVE EXAMPLE 3

A curing resin composition containing bisphenol A epoxy resin (Epikote 828 US, produced by Japan Epoxy Resin Co., Ltd.) 50 parts by weight and a hydrazide type curing agent (NDH, produced by Japan Hydrazine Co., Inc.) 25 parts by weight was sufficiently mixed by three rolls so as to be a uniform liquid to obtain a sealant and using the sealant, a liquid crystal display cell was fabricated.

COMPARATIVE EXAMPLE 4

An acrylic acid-modified and partly acrylated epoxy resin (D) (50% partly acrylated product) was produced by the same manner as (A), except that 1,4-butanediol diglycidyl ether (EX-214L, produced Nagase ChemteX Co.) 1,000 parts by weight was used in place of the phenol novolak type epoxy resin (D,E,N,431, produced by Dow Chemical Co.) 1,000 parts by weight.

A photocuring sealant was obtained by the same manner as Example 1, except that acrylic acid-modified partly acrylated epoxy resin (D) 60 parts by weight was used in place of the acrylic acid-modified phenol novolak epoxy resin 40 parts by weight and the urethane-modified partly acrylated product (C) 20 parts by weight and using the sealant, a liquid crystal display cell was fabricated.

With respect to the sealants produced in Examples 1 and 2 and Comparative Examples 1 to 4, ion conductivity of the extracted water before curing, the specific resistance value, the gelling ratio, the glass transition temperature, the nitrogen atom ratio after curing, the volume resistivity, the dielectric constant at 100 kHz, the glass transition temperature, the contact angle with water, and the storage stability were evaluated by the following methods and the color unevenness was evaluated by the following method for each of the fabricated liquid crystal display cells. The results are shown in Table 1.

(Ion Conductivity of Extracted Water of Sealant Before Curing)

Each sealant before curing 12.5 g was dissolved in toluene 12.5 g, further mixed with pure water 50 g, and stirred for 30 minutes, and a water layer part was separated by centrifugal separation and ion conductivity of the extracted water was measured by an ion conductivity meter (ES-12, manufactured by Horiba, Ltd.).

(Specific Resistance Value of Sealant Before Curing)

With respect to each sealant before curing, the specific resistance was measured using a specific resistance meter (SR-6517 model, manufactured by Toyo Corporation.) and an electrode for a liquid (LE-21 model, Ando Electoric Co., Ltd.) in standardized temperature and humidity state (20° C., 65% RH)

(Gelling Ratio of Sealant)

Each sealant cured by heating at 120° C. for 1 hour was immersed in acetone for 24 hours and the weight in dry state was measured before and after the immersion, and the gelling ratio was calculated from the following equation.

Gelling ratio (%)=(the weight in dry state after immersion/the weight in dry state before immersion)×100.

(Glass Transition Temperature of Sealant)

Measurement was carried out by DMA method under conditions of temperature raising ratio of 5° C./minute and 10 Hz frequency. The measurement was carried out for the light-shielded parts and for light-unshielded parts.

(Nitrogen Atom Ratio of Sealant After Curing)

Element analysis was carried out for each sealant after curing and the nitrogen atom ratio (%) was calculated from the following equation (1);

nitrogen atom ratio(%)={(total nitrogen atoms)/(total carbon atoms+total hydrogen atoms+total nitrogen atoms)}×100    (1).

(Volume Resistivity of Sealant After Curing)

Each sealant was thinly and evenly applied to a chromium-deposited surface of chromium-deposited glass substrate and then cured by UV radiation to form a UV-cured product with a size of 85 mm×85 mm and a thickness of 3 m and a chromium-deposited glass substrate was overlaid while the chromium-deposited face being set on the UV-cured product side and a load was applied and thermal and pressure bonding was carried out at 120° C. for 1 hour on a hot plate to produce a test sample the area (S (cm$^2$)) of the sealant in the test sample and, a constant voltage (V (V)) was applied between the opposed chromium-deposited face of the chromium-deposited glass substrate using a constant voltage generation apparatus (PA 36-2A regulated DC power supply, Kenwood Corporation.) and the electric current (A (A)) flowing in the film was measured by an ammeter (R 644 C Digital Multimeter, Advantest Co., Ltd.). When T represented the film pressure of the sealant (T (cm)), the volume resistivity (Ω·cm) was calculated from the following equation:

volume resistivity(Ω·cm)=(V×S)/(A×T)

The voltage application was carried out at d.c. 500 V for 1 minute.

(Dielectric Constant of Sealant at 100 kHz After Curing)

A test specimen with a size of 60 mm×60 mm and a thickness of 3 m was produced by applying each sealant thinly and evenly to a glass plate and curing the sealant. Measurement was carried out according to ASTM D150 by an electrode non-contact method (a gap method) at 100 kHz using an electrode for dielectric measurement (HP 16451B, manufactured by Yokokawa HP Co., Ltd.) and LCR meter (4284A, manufactured by Hewlett-Packard Ltd.)

(Contact Angle of Sealant with Water After Curing)

A test specimen was produced by applying each sealant thinly and evenly to a glass plate and curing the sealant. Measurement was carried out using a contact angle measurement apparatus (manufactured by Kyowa Interface Science Co., Ltd.) after droplets of water were formed on the specimen.

(Evaluation of Storage Stability)

Evaluation was carried out according to the following criteria; when the viscosity of each sealant before curing which was measured by an E type viscometer after 1-week storage at a room temperature was within two times as high as the initial viscosity, ○ was marked and when it was two times or higher, x was marked.

(Evaluation of Color Unevenness)

With respect to each liquid crystal display cell, occurrence of the color unevenness caused in the liquid crystal in the peripheral part of the sealing part was observed before or after the liquid crystal display cell was left in conditions of 60° C. and 95% RH for around 500 hours, and the evaluation of the liquid crystal polluting property was carried out on the basis of four-grade criteria; ⊚ (completely free from color unevenness); ○ (color unevenness barely observed); Δ (color unevenness slightly observed); and x (color unevenness rather clearly observed). For every section, 5 specimens were used for the evaluation.

EXAMPLE 3

(Synthesis of Benzoin Ether Compound A)

Potassium hydroxide 0.4 g was dissolved in ethanol 5 mL and dimethyl sulfoxide 200 mL was further added to obtain a solution. Benzoin methyl ether 30 g (0.13 mol) was dissolved in the solution and paraformaldehyde 5 g (0.16 mol) was added and reacted at 40° C. for 3 hours under nitrogen current. After that, the reaction product was cooled to a room temperature and neutralized with a dilute hydrochloric acid and then saturated salt water 120 mL was added. The solution was extracted by ethyl acetate and the extracted liquid was washed with saturated salt water three times. The washed product was dried and concentrated by anhydrous magnesium sulfate and recrystallized by diethyl ether. α-methylol benzoin methyl ether (MBME) was obtained in such a manner.

The obtained MBME was reacted with an equimolar amount of tolylene diisocyanate at 60° C. for 1 hour in the presence of dibutyl tin dilauryl in a catalytic amount and then 2-hydroxyethyl acrylate in an equimolar amount to that of MBME was added and further reaction was carried out at 60° C. for 1 hour to obtain a benzoin ether compound A shown as follows.

TABLE 1

| | | Example 1 | Example 2 | Comparative Example 1 | Comparative Example 2 | Comparative Example 3 | Comparative Example 4 |
|---|---|---|---|---|---|---|---|
| Composition | Acrylic acid-modified phenol novolak epoxy resin | 40 | 40 | — | 35 | — | — |
| | Urethane acrylate | — | — | 35 | — | — | — |
| | Urethane-modified and partially acrylated product | 20 | — | — | — | — | — |
| | Acrylic acid-modified propyleneoxide bisphenol A type epoxy resin | — | 20 | — | — | — | — |
| | 2-hydroxybutyl acrylate | — | — | 15 | — | — | — |
| | Bisphenol A epoxy resin | — | — | — | 25 | 50 | — |
| | Isobornyl acrylate | — | — | 50 | — | — | — |
| | Acrylic acid-modified partially acrylated epoxy resin | — | — | — | — | — | 60 |
| | Hydrazide type curing agent (VDH) | 15 | — | — | — | — | — |
| | Hydrazide type curing agent (NDH) | — | 15 | — | 15 | 25 | 15 |
| Evaluation | Nitrogen atom ratio | 4.3 | 5.7 | 4.1 | 2.7 | 4.4 | 2.2 |
| | Hydrogen bonding type functional group value | $4.1 \times 10^{-3}$ | $3.5 \times 10^{-4}$ | $2.2 \times 10^{-5}$ | $2.8 \times 10^{-6}$ | $2.7 \times 10^{-7}$ | $5.4 \times 10^{-8}$ |
| | Existence of components with number average molecular weight of 300 or higher | Absence | Absence | Absence | Absence | Absence | Presence |
| | Ion conductivity of extracted water | 15 | 18 | 600 | 200 | 20 | 40 |
| | Specific resistance value (Ω · cm) | $1.8 \times 10^9$ | $1.2 \times 10^9$ | $6.0 \times 10^5$ | $4.0 \times 10^9$ | $5.0 \times 10^{10}$ | $4.8 \times 10^6$ |
| | Volume resistivity (Ω · cm) | $1.5 \times 10^{13}$ | $2.1 \times 10^{13}$ | $1.2 \times 10^{13}$ | $2.4 \times 10^{13}$ | $3.0 \times 10^{13}$ | $1.1 \times 10^{13}$ |
| | Dielectric constant (100 kHz) | 3.4 | 3.2 | 3.4 | 3.6 | 3.1 | 3.6 |
| | Contact angle | 43 | 41 | 48 | 45 | 50 | 50 |
| | Gelling ratio | 95 | 95 | 20 | 90 | 95 | 90 |
| | Glass transition temperature/light-shielded part (° C.) | 65 | 65 | — | 70 | 80 | 60 |
| | Glass transition temperature/light-unshielded part (° C.) | 120 | 120 | 60 | 130 | 140 | 100 |
| | Storage stability | ○ | ○ | ○ | X | ○ | X |
| | Color unevenness evaluation (Initial) | ⊚⊚⊚⊚⊚ | ⊚⊚⊚⊚⊚ | ○○○○○ | XXXXX | XXXXX | ΔΔΔΔΔ |
| | Color unevenness evaluation (After humidity resistance evaluation) | ⊚⊚⊚⊚⊚ | ⊚⊚⊚⊚⊚ | XXXXX | XXXXX | XXXXX | XXXXX |

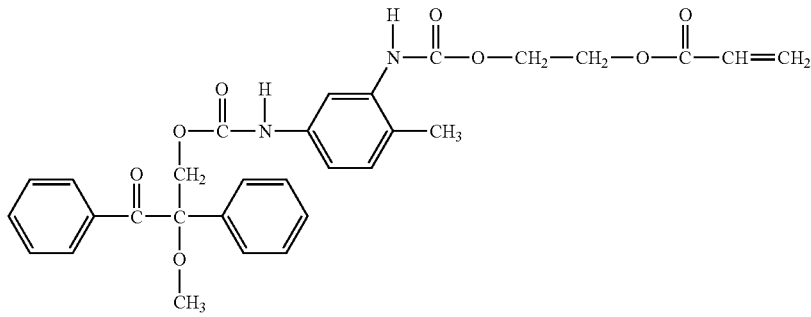

EXAMPLE 4

(Synthesis of Benzoin Ether Compound B)

α-2-carboxyethyl-benzoine methyl ether (BAE-CO$_2$H) was obtained in the same manner as that for production of the benzoin ether compound A, except that acrylic acid was used in place of the paraformaldehyde. Glycidyl methacrylate in an amount equivalent by mole and trimethylamine in a catalytic amount were added to the obtained BAE-CO$_2$H and reaction was carried out at 80° C. for 4 hours to obtain a benzoin ether compound B shown as follows.

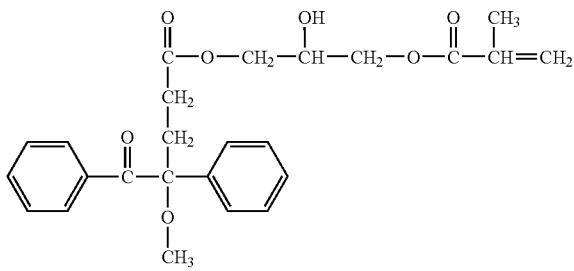

EXAMPLE 5

As a resin, bisphenol A type epoxy acrylate (EB 3700, produced by Daicel UCB Co., Ltd.) 30 parts by weight, bisphenol A type epoxy resin (EPICRONE 850 CRP, produced by Dainippon Ink and Chemicals, Inc.) 50 parts by weight, and benzoin ether compound A as a polymerization initiator 2 parts by weight were stirred by a planetary type stirring apparatus. After that, spherical silica (SO—C1, produced by Admafine Co., Ltd.) 15 parts by weight and 2-phenyl-4,5-dihydroxymethylimidazole (produced by Shikoku Corp.) 3 parts by weight were dispersed by three rolls to obtain a sealant.

Using the obtained sealant, a liquid crystal display cell was fabricated in the same manner as Example 1.

EXAMPLE 6

A sealant was obtained in the same manner as Example 5, except that benzoin ether compound B 2 parts by weight was used as a polymerization initiator in place of the benzoin ether compound A as a polymerization initiator 2 parts by weight and using the sealant, a liquid crystal display cell was fabricated.

COMPARATIVE EXAMPLES 7 TO 9

Sealant production and liquid crystal display cell fabrication were carried out in the same manner as Example 5, except that oligo[2-hydroxy-2-methyl-1-[4-(1-methylvinyl) phenyl]propanone] (KIP-150, produced by Lamberti Co.) was used as a high molecular weight type initiator for Comparative Example 7, benzoin isopropyl ether (Solvaslon BIPE, produced by Kurogane Kasei Co., Ltd.) was used for Comparative Example 8, 2-hydroxy-2-methyl-1-phenylpropane-1-one (IR-1173, produced by Ciba Specialty Chemicals Co., Ltd.) as a hydroxyl-containing initiator was used for Comparative Example 9 in place of the benzoin ether compound A as a polymerization initiator.

COMPARATIVE EXAMPLE 10

Sealant production and liquid crystal display cell fabrication were carried out in the same manner as Example 6, except that 2-hydroxy-2-methyl-1-phenylpropane-1-one (IR-1173, produced by Ciba Specialty Chemicals Co., Ltd.) as a hydroxyl-containing initiator was used in place of the benzoin ether compound B2 as a polymerization initiator.

With respect to the liquid crystal display panels fabricated in Examples 5 and 6 and Comparative Examples 7 to 10, the evaluation of voltage holding ratio and the evaluation of the elution to the liquid crystal were carried out according to the following methods.

(Evaluation of the Voltage Holding Ratio of Liquid Crystal Display Panel)

The voltage holding ratio of each of the fabricated liquid crystal display panels was measured by using VHR-1A manufactured by Toyo Corporation. immediately after fabrication and after the reliability test (60° C./95% RH/1,000 hours)

(Evaluation of Elution to Liquid Crystal)

Each of the fabricated liquid crystal display panels was disassembled and the liquid crystal part was analyzed by GC-MS and in the case where no peak other than peaks attributed to the liquid crystal was observed, ○ was assigned and in the case where a peak attributed to a polymerization initiator was observed, x was assigned.

TABLE 2

|  |  | Example 5 | Example 6 | Comparative Example 7 | Comparative Example 8 | Comparative Example 9 | Comparative Example 10 |
|---|---|---|---|---|---|---|---|
| Evaluation by GC-MS |  | ○ | ○ | X | X | X | X |
| Voltage holding ratio (%) | Initial stage | 97 | 97 | 92 | 90 | 92 | 90 |
|  | After the reliability test | 95 | 95 | 87 | 85 | 87 | 85 |

EXAMPLE 7

A composition containing partly acrylated epoxy resin as a resin for a sealant (UVAC 1561, produced by Daicel UCB Co., Ltd.) 40 parts by weight, bisphenol F type epoxy resin (EPICRONE 830 S, produced by Dainippon Ink and Chemicals, Inc.) 17 parts by weight, spherical silica (SO—C1, produced by Admafine Co., Ltd.) as a filler 15 parts by weight, Fujicure FXR-1030 (produced by Fuji Kasei Kogyo Co., Ltd.) as an epoxy thermosetting agent 15 parts by weight, Irgacure 907 (produced by Ciba-Specialty Chemicals Corp.) as a photoradical initiator 3 parts by weight, and IM-1000 (produced by Japan Energy Co., Ltd.) as an imidazolsilane compound 5 parts by weight was sufficiently mixed by three rolls so as to be a uniform liquid to obtain a sealant.

Using the obtained sealant, a liquid crystal display cell was fabricated in the same manner as Example 1.

EXAMPLE 8

(1) Synthesis of Imidazolesilane Compound

The following imidazolesilane compound was obtained by dropwise titrated γ-isocyanatopropyltrimethoxysialne in an equimolar amount for 1 hour to a solution, which was obtained by dissolving 2-phenyl-4-methyl-5-hydroxymethylimidazole in dehydrated trihydroxyfuran (THF) in an amount three times as much as the imidazole and further adding dibutyl tin dilauryl in a catalytic amount to the resulting solution, under conditions of heating at 60° C. and refluxing in argon atmosphere and then heating and refluxing the mixture at 60° C. further for 1 hour and removing THF from the obtained solution by evaporation.

(9)

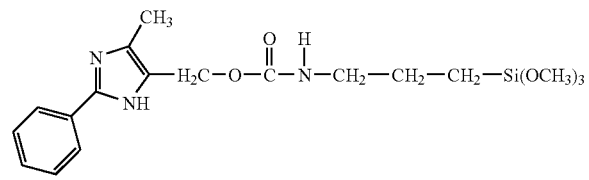

(2) Production of Sealant and Fabrication of Liquid Crystal Cell.

Sealant production and liquid crystal display cell fabrication were carried out in the same manner as Example 7, except that the obtained imidazolesilane compound was added in place of IM-1000.

EXAMPLE 9

A filler treated with an imidazolesilane compound was obtained by mixing spherical silane (SO—C1, produced by Admafine Co., Ltd.) as a filler 100 parts by weight, an imidazolesilane compound (IS-1000, produced by Japan Energy Co., Ltd.) 0.2 parts by weight, and ethanol 100 parts by weight, stirring the mixture at 60° C. for 1 hour, removing the volatile components, and further drying the mixture at 100° C. further for 1 hour under reduced pressure.

Sealant production and liquid crystal display cell fabrication were carried out in the same manner as Example 7, except that the obtained filler treated with the imidazolesilane compound was added in place of the spherical silica (SO—C1).

COMPARATIVE EXAMPLE 11

Sealant production and liquid crystal display cell fabrication were carried out in the same manner as Example 7, except that γ-glycidoxypropyltrimethoxysilane was added in place of IM-1000.

COMPARATIVE EXAMPLE 12

Sealant production and liquid crystal display cell fabrication were carried out in the same manner as Example 7, except that γ-aminopropyltrimethoxysilane was added in place of IM-1000.

COMPARATIVE EXAMPLE 13

Sealant production and liquid crystal display cell fabrication were carried out in the same manner as Example 7, except that no imidazole compound (IM-1000) was added.

With respect to the sealants produced by Examples 7 to 9 and Comparative Examples 9 to 11, the storage stability and the specific resistance value before curing were evaluated by the above-mentioned methods. Further, adhesion property was evaluated by the following method. Also, the color unevenness was evaluated by the above-mentioned method for the fabricated liquid crystal cells.

The results are shown in Table 3.

(Evaluation of Adhesion Property)

Polymer beads with an average particle diameter of 5 μm (Micropearl SP, produced by Sekisui Chemical. Co., Ltd.) 3 parts by weight was dispersed by a planetary stirring apparatus in each sealant 100 parts by weight to obtain a uniform liquid and an extremely slight amount of the obtained sealant was put on a center of a slide glass and another slide glass was overlaid on it to spread the sealant and UV rays with an intensity of 50 mW/cm² were radiated for 60 seconds. After that, heating was carried out at 120° C. for 1 hour to obtain an adhesion test specimen. The test specimen was subjected to the adhesion strength measurement using a tension gauge.

TABLE 3

|  | Example 7 | Example 8 | Example 9 | Comparative Example 11 | Comparative Example 12 | Comparative Example 13 |
|---|---|---|---|---|---|---|
| Color unevenness | ⊚ | ⊚ | ⊚ | XX | ○ | ⊚ |
| Adhesion force | 1.5 | 1.7 | 2.2 | 1.5 | 1.6 | 0.7 |
| Storage stability | 1.2 | 1.2 | 1.2 | 1.4 | 2.5 | 1.1 |
| Specific resistance value before curing | $1.3 \times 10^9$ | $1.7 \times 10^9$ | $2.2 \times 10^9$ | $1.2 \times 10^9$ | $9.8 \times 10^9$ | $2.9 \times 10^9$ |

EXAMPLE 10

Partly acrylated epoxy resin (UVAC 1561, produced by Daicel UCB Co., Ltd.) as a resin for a sealant 25 parts by weight, urethane-modified partly acrylated epoxy resin produced as (C) 40 parts by weight, and an aminosilane compound (KBM 603, Shin-Etsu Chemical Co., Ltd.) 1 part by weight were mixed and stirred. The obtained resin composition was heated and stirred at 40° C. for 1 hour and at 60° C. for 1 hour to obtain a sealant.

Next, spherical silane (SO—C1, produced by Admafine Co., Ltd.) as a filler 17 parts by weight, Fujicure FXR-1030 (produced by Fuji Kasei Kogyo Co., Ltd.) as an epoxy thermosetting agent 14 parts by weight, and the benzoin ether compound A produced in Example 3 as a photoradical initiator 3 parts by weight were added and sufficiently mixed by three rolls so as to be an even liquid.

The viscosity measurement of the sealant subjected to heating treatment was carried out immediately after the heating and then the sealant was stored at −10° C. and the viscosity measurement was carried out after 1 day and 1 week. The results are shown in Table 4.

The obtained sealant was subjected to $^1$H-NMR measurement and the remaining ratio of $NH_2$ groups after reaction was calculated from the integrated value of the $NH_2$ peaks (1.25 ppm) to find it less than 1%. The sealant was heated at 120° C. for 1 hour in a liquid crystal (5004 LA, produced by Chisso Corporation) and then the voltage holding ratio (at 60 Hz) of the liquid crystal was measured to find it as high as 90% and accordingly the sealant was found to be one scarcely polluting the liquid crystal.

COMPARATIVE EXAMPLE 14

A sealant was obtained in the same manner as Example 10, except that the heating treatment was eliminated.

Immediately after blending, the obtained sealant was stored at −10° C. and the viscosity measurement was carried out after 1 day and 1 week. The results are shown in Table 4.

The obtained sealant was subjected to $^1$H-NMR measurement and the remaining ratio of $NH_2$ groups after reaction was calculated from the integrated value of the $NH_2$ peaks (1.25 ppm) to find it 25%. The sealant was heated at 120° C. for 1 hour in the liquid crystal (5004 LA, produced by Chisso Corporation) and then the voltage holding ratio (at 60 Hz) of the liquid crystal was measured to find it as low as 66% and accordingly it was found that the liquid crystal was polluted with the remaining $NH_2$ groups.

TABLE 4

|  | Example 10 | Comparative Example 14 |
|---|---|---|
| After heating treatment | 315 Pa · s | — |
| Immediately after blending | — | 265 Pa · s |
| After one day | 315 Pa · s | 275 Pa · s |
| After one week | 315 Pa · s | 285 Pa · s |

EXAMPLE 11

(1) Surface Treatment of Curing Agent

Aerosil #200 (average particle diameter of 0.03 μm, produced by Nippon Aerosil Co., Ltd.) 10 parts by weight was added to 2-undecylimidazole ($C_{11}Z$: average particle diameter of 5 μm, produced by Shikoku Chemicals Corp.) 100 parts by weight and stirred for 3 minutes by a mini blender to obtain a white powder (a coated curing agent 1).

A coated curing agent 2 was obtained by changing the amount of Aerosil #200 of the coated curing agent 1 to 50 parts by weight.

A coated curing agent 3 was obtained by changing the amount of Aerosil #200 of the coated curing agent 1 to 1 part by weight.

A coated curing agent 4 was obtained by changing the coated particles of the coated curing agent 1 to SE5050 (average particle diameter of 0.03 μm, produced by Admafine Co., Ltd.) 20 parts by weight.

(2) Production of Curing Resin Composition

A composition containing partly acrylated epoxy resin (UVAC 1561, produced by Daicel UCB Co., Ltd.) as a curing resin 70 parts by weight, the urethane-modified partly acrylated compound produced as (C) 30 parts by weight, the spherical silica (SO—C1, produced by Admafine Co., Ltd.) as a filler 20 parts by weight, the coated curing agent 1 as a curing agent 6.6 parts by weight, and Irgacure 907 (produced by Ciba-Specialty Chemicals Corp.) as a photoradical initiator 3 parts by weight was sufficiently mixed by three rolls so as to be a uniform liquid to obtain a curing resin composition 1.

EXAMPLE 12

A curing resin composition 2 was obtained in the same manner as Example 11, except that the coated curing agent 2 9 parts by weight was used in place of the coated curing agent 1 6.6 parts by weight.

EXAMPLE 13

A curing resin composition 3 was obtained in the same manner as Example 11, except that the coated curing agent 3 6.06 parts by weight was used in place of the coated curing agent 1 6.6 parts by weight.

EXAMPLE 14

A curing resin composition 4 was obtained in the same manner as Example 11, except that the coated curing agent 4 6.6 parts by weight was used in place of the coated curing agent 1 6.6 parts by weight.

COMPARATIVE EXAMPLE 15

A curing resin composition 5 was obtained in the same manner as Example 11, except that the 2-undecylimidazole which is not subjected to the coating treatment 6 parts by weight was used in place of the coated curing agent 1 6.6 parts by weight.

The storage stability and the curing property of each of the curing resin compositions produced by Examples 11 to 14 and Comparative Example 15 were evaluated by the following method. The results are shown in Table 5.

(Storage Stability Evaluation)

The number of days until the viscosity became two times as high as the viscosity immediately after blending during the storage of each curing resin composition under conditions of 23° C. and 50% RH was counted.

(Curing Property Evaluation)

The evaluation was carried out by immersing the cured product obtained by curing at 120° C. for 1 hour in a considerably excess amount of THF, shaking the product at 23° C. for 24 hours, drying it at 80° C. for 3 hours, and dividing the weight value (g) of the dried product with the weight value (g) before the immersion. Observation of the obtained cured product by a transmission electron microscope made it clear that the agent of coating the surface of the curing agent existed in the cured product in such a state that the agent draws circles.

(3) Fabrication of Liquid Crystal Panel

Screen printing on a seal part of one of two glass substrates bearing transparent electrodes of ITO thin layers or the like was carried out using a thermocuring epoxy resin (a sealant) while leaving a liquid crystal injecting inlet as it was. Next, heating at 80° C. was carried out for 3 minutes to preliminarily dry the sealant and stuck it to the substrate and then the substrate was turned back at a room temperature. After that, the other glass substrate was set on the opposite to the former substrate and press-bonded for 10 minutes using a thermal press heated at 130° C. to cure the sealant.

After the empty panel obtained in such a manner was vacuum evacuated and a liquid crystal was injected (ZL 11636, Merck & Co., Inc.) and the injection inlet was sealed by the end-sealing material produced as the above-mentioned manner and UV rays with intensity of 50 mW/cm$^2$ were radiated for 60 seconds using a high pressure mercury lamp. Finally, liquid crystal annealing was carried out at 120° C. for 1 hour to fabricate a liquid crystal display cell.

EXAMPLE 16

A liquid crystal panel was fabricated in the same manner as Example 15, except that a kaolinite-group compound (ASP-400 P, produced by ENGELHARD Co.) was used for refining the end-sealing material in place of the hydrotalcite-group compound.

EXAMPLE 17

A liquid crystal panel was fabricated in the same manner as Example 15, except that diatomaceous earth (Radiolite #200) was used for refining the end-sealing material in place of the hydrotalcite-group compound.

TABLE 5

|  | Example 11 | Example 12 | Example 13 | Example 14 | Comparative Example 15 |
| --- | --- | --- | --- | --- | --- |
| Initial viscosity (mPa · s) | 350000 | 600000 | 300000 | 345000 | 320000 |
| The number of days until the viscosity becomes two times as high as the initial viscosity | 8 days | 8 days | 6 days | 6 days | 3 days |
| Curing property | 99% | 98% | 99% | 98% | 98% |

EXAMPLE 15

(1) Preparation of End-Sealing Material

Bisphenol A type epoxy acrylate (EB 3700, produced by Daicel UCB Co., Ltd.) as an acrylic resin 50 parts by weight, urethane acrylate (EB 8402, produced by Daicel UCB Co., Ltd.) 38 parts by weight, hydroxyethyl acrylate 10 parts by weight, and further a photoinitiator (IR-651, Ciba Specialty Chemicals Co., Ltd.) 2 parts by weight were heated to 70° C. to dissolve the photoinitiator and then stirred by a planetary stirring apparatus to prepare an end-sealing material for a liquid crystal panel.

(2) Refinement of End-Sealing Material

A hydrotalcite-group compound (Kyowaad 1000, produced by Kyowa Chemical Industry Co., Ltd.) 12.5 parts by weight was added to the obtained end-sealing material 100 parts by weight and stirred at 60° C. for 30 minutes and then the resulting mixture was filtered using a filtration sheet made of polytetrafluoroethylene (PTFE) for refining.

COMPARATIVE EXAMPLE 16

A liquid crystal panel was fabricated in the same manner as Example 15, except that silica (SO—C5, produced by Admafine Co., Ltd.) was used for refining the end-sealing material in place of the hydrotalcite-group compound.

COMPARATIVE EXAMPLE 17

A liquid crystal panel was fabricated in the same manner as Example 15, except that no hydrotalcite-group compound was use and refining of the end-sealing material was not carried out.

COMPARATIVE EXAMPLE 18

The end-sealing material before the refining in Example 15 was refined without using the hydrotalcite-group compound in the following manner.

The above-mentioned end-sealing material 12.5 g was dissolved in toluene 12.5 g to obtain a toluene solution and pure water 50 g was added to the solution and stirred for 30 minutes. The resulting mixture was separated into a toluene solution part and a water layer part by centrifugal separation and only the water layer part was taken out. After that, the toluene solution was heated to 80° C. and stirred for 30 minutes under 133.3 Pa and except these steps, a liquid crystal panel was fabricated in the same manner as Example 15.

EXAMPLE 18

Bisphenol A type epoxy acrylate (EB 3700, produced by Daicel UCB Co., Ltd.) as an acrylic resin 50 parts by weight and propylene oxide partly acrylated product produced as (B) 30 parts by weight were stirred by a planetary stirring apparatus.

(Ion Conductivity of Extracted Water Measurement)

Each of the obtained end-sealing material before curing 12.5 g was dissolved in toluene 12.5 g and pure water 50 g was added to the solution and stirred for 30 minutes and the water layer part was taken out by centrifugal separation and then the ion conductivity was measured using an ion conductivity meter (ES-12 manufactured by Horiba, Ltd.)

(Measurement of Voltage Holding Ratio)

An operation test of each of the obtained liquid crystal panels was carried out by measuring the voltage holding ratio immediately after the fabrication and after the reliability test (at 60° C. and 95% RH for 1,000 hours).

The evaluation of the color unevenness in the peripheral part of the liquid crystal injection inlet of each liquid crystal panel was carried out by visual observation after the reliable test.

TABLE 6

| | | Example 15 | Example 16 | Example 17 | Example 18 | Comparative Example 16 | Comparative Example 17 | Comparative Example 18 | Comparative Example 19 |
|---|---|---|---|---|---|---|---|---|---|
| Ion absorptive solid | | Hydrotalcite | Kaolinite | Diatomaceous earth | Hydrotalcite | Silica | Absence | Absence (Washing with water) | Absence (Washing with water) |
| Ion conductivity (mS/cm) | | 5 | 6 | 9 | 9 | 50 | 60 | 40 | 45 |
| Voltage holding ratio (%) | Initial stage | 97 | 97 | 95 | 95 | 88 | 85 | 90 | 90 |
| | After reliable test | 95 | 95 | 94 | 94 | 85 | 75 | 85 | 85 |
| Color unevenness of display panel | | Absence | Absence | Absence | Absence | Presence | Presence | Presence | Presence |

A hydrotalcite-group compound (Kyowaad 1000, produced by Kyowa Chemical Industry Co., Ltd.) 10 parts by weight was added to the obtained composition 80 parts by weight and stirred at 60° C. for 30 minutes and then the resulting mixture was filtered using a filtration sheet made of PTFE.

After that, a spherical silica (SO—C1, produced by Admafine Co., Ltd.) 15 parts by weight, 2-phenyl-4,5-dihydroxymethylimidazole (produced by Shikoku Chemicals Corp.) 3 parts by weight, and a photoinitiator (IR-651, Ciba Specialty Chemicals Co., Ltd.) 2 parts by weight were heated to 70° C. to dissolve the photoinitiator and then stirred by three rolls to produce an end-sealing material.

Using the obtained end-sealing material, a liquid crystal display panel was fabricated in the same manner as Example 1.

COMPARATIVE EXAMPLE 19

A liquid crystal panel was fabricated in the same manner as Example 18, except that the end-sealing material before the refining in the Example 18 was refined by washing with water according to the method of Comparative Example 16.

With respect to each sealant or end-sealing material produced by Examples 15 to 18 and Comparative Examples 16 to 19, ion conductivity of the extracted water before curing was measured by the following method and the voltage holding ratio and the color unevenness of each of the obtained liquid crystal panels were evaluated. The results are shown in Table 6.

INDUSTRIAL APPLICABILITY

The invention provides a curing resin composition suitable for fabricating a display apparatus especially by one drop fill process because in the case of using a sealant for a liquid crystal display element or an end-sealing material for a liquid crystal display element in the fabrication of the liquid crystal display element, the components of the composition are prevented from elution to the liquid crystal material and do not pollute the liquid crystal and also the components scarcely cause color unevenness in the liquid crystal display and storage stability is thus excellent, and the invention also provides such a sealant for a display element and such an end-sealing material for a display element using the composition.

The invention claimed is:

1. A coated curing agent,
   wherein the surface of a solid curing agent particle is coated with microparticle, wherein the solid curing agent is a curing agent in a solid state at a room temperature and which is melted or softened by heating to start reaction with a curing resin,
   wherein the microparticles are made of oxides, hydroxides or, halides of Si, Al, Ti, Fe, Mn, or Ma; or styrene beads or finely granular rubber.

2. The coated curing agent according to claim 1,
   wherein the weight ratio between the solid curing agent particles and the microparticles is 3: 1 to 50: 1.

3. The coated curing agent according to claim 1, wherein a particle diameter of the microparticle is not larger than 10% of the particle diameter of the solid curing agent particle.

4. The coated curing agent according to claim 1, wherein the solid curing agent particle comprises an amine compound.

5. The coated curing agent according to claim 1 wherein the solid curing agent particle comprises a solid amine compound, a phenol compound or an acid anhydride compound.

* * * * *